United States Patent
Mori

(10) Patent No.: US 10,873,351 B2
(45) Date of Patent: Dec. 22, 2020

(54) MULTIPLEXER, RADIO FREQUENCY FRONT-END CIRCUIT, AND COMMUNICATION DEVICE

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/809,819

(22) Filed: Mar. 5, 2020

(65) Prior Publication Data
US 2020/0204201 A1 Jun. 25, 2020

Related U.S. Application Data

(63) Continuation of application No. PCT/JP2018/028010, filed on Jul. 26, 2018.

(30) Foreign Application Priority Data

Sep. 8, 2017 (JP) .................. 2017-172700

(51) Int. Cl.
*H04B 1/40* (2015.01)
*H04B 1/00* (2006.01)
(Continued)

(52) U.S. Cl.
CPC ......... *H04B 1/0078* (2013.01); *H04B 1/0057* (2013.01); *H04B 1/0458* (2013.01); *H04B 1/0483* (2013.01)

(58) Field of Classification Search
CPC .. H04B 1/0078; H04B 1/0057; H04B 1/0458; H04B 1/0483; H04B 1/50; H04B 1/00;
(Continued)

(56) References Cited

U.S. PATENT DOCUMENTS 9,031,516 B2 * 5/2015 Wang .................. H03H 7/38
455/75
9,231,552 B2 * 1/2016 Taniuchi .............. H04B 1/18
(Continued)

FOREIGN PATENT DOCUMENTS

JP 2004-228666 A 8/2004
JP 2005-253019 A 9/2005
(Continued)

OTHER PUBLICATIONS

International Search Report Issued in Patent Application No. PCT/JP2018/028010 dated Oct. 2, 2018.
(Continued)

*Primary Examiner* — Pablo N Tran
(74) *Attorney, Agent, or Firm* — Pearne & Gordon LLP

(57) ABSTRACT

A multiplexer (1) includes: a demultiplexing circuit (11) including a common terminal (110c) and individual terminals (111 and 112); a filter (21) connected to the individual terminal (111); and a filter (22) connected to the individual terminal (112). The demultiplexing circuit (11) further includes an impedance circuit (Z1) provided in series on a path (r1) connecting the common terminal (110c) and the individual terminal (111), an impedance circuit (Z2) provided in series on a path (r2) connecting the common terminal (110c) and the individual terminal (112), and an impedance circuit (Z3) and a switch circuit (12). The switch circuit (12) connects only one of a node (N1) on the path (r1) between the impedance circuit (Z1) and the individual terminal (111) and a node (N2) on the path (r2) between the impedance circuit (Z2) and the individual terminal (112) to a ground with the impedance circuit (Z3) interposed therebetween.

17 Claims, 19 Drawing Sheets

(51) Int. Cl.
*H03H 7/12* (2006.01)
*H03H 7/46* (2006.01)
*H04B 1/04* (2006.01)

(58) Field of Classification Search
CPC ... H04B 1/52; H04B 1/18; H04B 1/40; H04B 1/48; H01P 1/15; H03H 7/46; H03H 7/12; H03H 9/64; H03H 9/72
See application file for complete search history.

(56) References Cited

U.S. PATENT DOCUMENTS

| | | | | |
|---|---|---|---|---|
| 9,941,582 | B2* | 4/2018 | Hayakawa | H03F 3/24 |
| 10,122,389 | B2* | 11/2018 | Kim | H04B 1/0057 |
| 10,256,851 | B2* | 4/2019 | Pehlke | H04B 1/0057 |
| 10,476,453 | B2* | 11/2019 | Ayranci | H04B 1/16 |
| 10,715,109 | B2* | 7/2020 | Matsutani | H03H 9/70 |
| 2016/0127015 | A1 | 5/2016 | Wloczysiak et al. | |
| 2018/0343000 | A1 | 11/2018 | Nosaka | |
| 2019/0097606 | A1 | 3/2019 | Nosaka | |
| 2019/0181907 | A1* | 6/2019 | Pfann | H04B 1/10 |
| 2019/0222238 | A1* | 7/2019 | Bai | H04B 1/04 |
| 2019/0379352 | A1* | 12/2019 | Nosaka | H03H 9/14541 |
| 2020/0083865 | A1 | 3/2020 | Mori | |
| 2020/0177214 | A1* | 6/2020 | Nagumo | H03F 3/245 |
| 2020/0252092 | A1* | 8/2020 | Hisano | H04B 1/0057 |
| 2020/0280296 | A1* | 9/2020 | Mori | H03H 7/0115 |

FOREIGN PATENT DOCUMENTS

| | | |
|---|---|---|
| JP | 3866989 B2 | 1/2007 |
| WO | 2017-138539 A1 | 8/2017 |
| WO | 2017-138540 A1 | 8/2017 |
| WO | 2018-212048 A1 | 11/2018 |

OTHER PUBLICATIONS

Written Opinion Issued in Patent Application No. PCT/JP2018/028010 dated Oct. 2, 2018.

* cited by examiner

MULTIPLEXER, RADIO FREQUENCY FRONT-END CIRCUIT, AND COMMUNICATION DEVICE

This is a continuation of International Application No. PCT/JP2018/028010 filed on Jul. 26, 2018 which claims priority from Japanese Patent Application No. 2017-172700 filed on Sep. 8, 2017. The contents of these applications are incorporated herein by reference in their entireties.

BACKGROUND

Technical Field

The present disclosure relates to a multiplexer, and a radio frequency front-end circuit and a communication device including the same.

As a radio frequency front-end circuit supporting a plurality of frequency bands (hereinafter, referred to as "bands" in some cases), a radio frequency module including a switch and a plurality of filters corresponding to the plurality of bands is disclosed (see, for example, Patent Document 1). According to this radio frequency module, by the switch provided on a main path for transmitting a radio frequency signal between an input terminal and an output terminal being switched, a filter for allowing the radio frequency signal to pass therethrough is switched.

Patent Document 1: U.S. Patent Application Publication No. 2016/0127015

BRIEF SUMMARY

The above-mentioned existing circuit configuration including the switch and the plurality of filters can be applied to a multiplexer used in a radio frequency front-end circuit. Such a multiplexer is required to be reduced in loss in a pass band.

However, in the multiplexer using the above-mentioned existing configuration, since the switch is provided on the main path for transmitting the radio frequency signal between the input terminal and the output terminal, isolation is secured, but there is a problem in that the reduction in loss in the pass band is prevented due to loss caused by on-resistance of the switch.

A multiplexer, and a radio frequency front-end circuit and a communication device including the same of the present disclosure reduces loss in a pass band while securing isolation.

A multiplexer according to an aspect of the present disclosure includes a demultiplexing circuit including a first common terminal and a first individual terminal and a second individual terminal; a first filter connected to the first individual terminal and configured to allow a radio frequency signal in a first frequency band to pass therethrough; and a second filter connected to the second individual terminal and configured to allow a radio frequency signal in a second frequency band at least partially overlapping with the first frequency band to pass therethrough, in which the demultiplexing circuit further includes a first impedance circuit provided in series on a first path connecting the first common terminal and the first individual terminal, a second impedance circuit provided in series on a second path connecting the first common terminal and the second individual terminal, and a third impedance circuit and a switch circuit, and the switch circuit connects only one of a first node on the first path between the first impedance circuit and the first individual terminal and a second node on the second path between the second impedance circuit and the second individual terminal to a ground with the third impedance circuit interposed therebetween.

With the configuration as described above, by appropriately designing the first impedance circuit, the second impedance circuit, and the third impedance circuit, it is possible to reduce loss in the pass band while securing isolation. Specifically, when the first node is connected to the ground with the third impedance circuit interposed therebetween by the switch circuit, the demultiplexing circuit can reduce the loss in the pass band, while securing isolation of the radio frequency signal output to the first individual terminal with the radio frequency signal output to the second individual terminal. On the other hand, when the second node is connected to the ground with the third impedance circuit interposed therebetween by the switch circuit, the demultiplexing circuit can reduce the loss in the pass band, while securing isolation of the radio frequency signal output to the second individual terminal with the radio frequency signal output to the first individual terminal. Accordingly, a multiplexer capable of reducing the loss in the pass band while securing the isolation can be obtained.

Furthermore, the first path and the second path may be made common from the first common terminal to a branch point, the first impedance circuit may be provided on the first path between the branch point and the first individual terminal, and the second impedance circuit may be provided on the second path between the branch point and the second individual terminal.

Furthermore, when the second node is connected to the ground with the third impedance circuit interposed therebetween by the switch circuit, impedance of the demultiplexing circuit at the first individual terminal may be substantially equal to a normalized impedance in the first frequency band (the deviation of the impedance can be within ±10% of the normalized impedance in the first frequency band), and impedance of the demultiplexing circuit at the second individual terminal may be substantially equal to 0Ω (the deviation of the impedance can be 5Ω or less) or infinity (the deviation of the impedance can be 500 kΩ or more) in the second frequency band.

In this manner, in the above-mentioned case, the impedance of the demultiplexing circuit at the first individual terminal is substantially equal to the normalized impedance in the first frequency band. This makes it possible to suppress reflection loss of the radio frequency signal in the first frequency band due to impedance mismatching (hereinafter, simply referred to as "mismatching") at the first individual terminal. Furthermore, in the above-mentioned case, the impedance of the demultiplexing circuit at the second individual terminal is substantially equal to 0Ω or infinity in the second frequency band. This makes it possible to prevent the radio frequency signal in the second frequency band from passing through the second individual terminal. That is, the radio frequency signal in the second frequency band that may pass through the second individual terminal can be attenuated. Accordingly, when the first frequency band is used, that is, when the radio frequency signal in the first frequency band is allowed to pass, it is possible to reduce the loss in the first frequency band and to increase the attenuation in the second frequency band.

Furthermore, when the first node is connected to the ground with the third impedance circuit interposed therebetween by the switch circuit, the impedance of the demultiplexing circuit at the second individual terminal may be substantially equal (the deviation of the impedance can be less than 0.0001Ω of the normalized impedance in the first frequency band) to a normalized impedance in the second frequency band, and the impedance of the demultiplexing circuit at the first individual terminal may be substantially equal (the deviation of the impedance can be less than 0.0001Ω in the second frequency band) to 0Ω or infinity in the first frequency band.

In this manner, in the above-mentioned case, the impedance of the demultiplexing circuit at the second individual terminal is substantially equal to the normalized impedance in the second frequency band. This makes it possible to suppress reflection loss of the radio frequency signal in the second frequency band due to mismatching at the second individual terminal. Furthermore, in the above-mentioned case, the impedance of the demultiplexing circuit at the first individual terminal is substantially equal to 0Ω or infinity in the first frequency band. This makes it possible to prevent the radio frequency signal in the first frequency band from passing through the first individual terminal. That is, the radio frequency signal in the first frequency band that may pass through the first individual terminal can be attenuated. Accordingly, when the second frequency band is used, that is, when the radio frequency signal in the second frequency band is allowed to pass, it is possible to reduce the loss in the second frequency band and to increase the attenuation in the first frequency band. Therefore, in view of the effect achieved when the second frequency band is used as described above and the above-described effect achieved when the first frequency band is used, both when the first frequency band is used and when the second frequency band is used, it is possible to reduce the loss in the pass band while securing the isolation.

Furthermore, the first impedance circuit may be a first capacitor provided in series on the first path.

Here, an inductor has a worse Q value than a capacitor in many cases. Therefore, by the first impedance circuit being the first capacitor, it is possible to reduce the loss in the pass band when the first frequency band is used.

Furthermore, the second impedance circuit may be a second capacitor provided in series on the second path.

As described above, an inductor has a worse Q value than a capacitor in many cases. Therefore, by the second impedance circuit being the second capacitor, it is possible to reduce the loss in the pass band when the second frequency band is used.

Furthermore, the third impedance circuit may be an LC series resonance circuit in which a first inductor and a third capacitor are connected in series, and may have a resonant frequency in which impedance is minimized in or in the vicinity of a frequency band in which the first frequency band and the second frequency band overlap with each other.

By the third impedance circuit including the resonant frequency as described above, it is possible to further increase the attenuation of the second frequency band when the first frequency band is used, and it is possible to further increase the attenuation of the first frequency band when the second frequency band is used. Accordingly, both when the first frequency band is used and when the second frequency band is used, the isolation can be improved.

Furthermore, the first path and the second path may be made common from the first common terminal to the branch point, and the demultiplexing circuit may further include a fourth impedance circuit provided in a common connection portion in which the first path and the second path are made common.

By including the fourth impedance circuit as described above, the impedance of the demultiplexing circuit at the first common terminal can be adjusted to a desired impedance. Accordingly, since the reflection loss due to the mismatching at the first common terminal can be suppressed, it is possible to further reduce the loss in the pass band.

Furthermore, the fourth impedance circuit may be a fourth capacitor provided in series in the common connection portion.

As described above, an inductor has a worse Q value than a capacitor in many cases. Therefore, by the fourth impedance circuit being the fourth capacitor, both when the first frequency band is used and when the second frequency band is used, it is possible to reduce the loss in the pass band.

Furthermore, the fourth impedance circuit may be a second inductor connecting a node of the common connection portion and the ground to each other.

With this, when the impedance of the first common terminal indicates to be capacitive when the fourth impedance circuit is not provided, by providing the fourth impedance circuit which is the second inductor, the impedance of the first common terminal can be made close to the normalized impedance. Accordingly, at the first common terminal, since the reflection loss due to the mismatching can be suppressed, it is possible to reduce the loss in the pass band. This is particularly useful when an acoustic wave filter or the like is used in which impedance indicates to be capacitive in many cases as the first filter and the second filter.

Furthermore, the fourth impedance circuit may include a fourth capacitor provided in series in the common connection portion and a second inductor connecting the node of the common connection portion and the ground to each other.

This makes it possible to widen an impedance adjustment range of the demultiplexing circuit at the first common terminal. Accordingly, at the first common terminal, since the reflection loss due to the mismatching can be further suppressed by more accurately matching, it is possible to further reduce the loss in the pass band.

Furthermore, the switch circuit may include a first switch element having one terminal connected to the first node and another terminal connected to the ground with the third impedance circuit interposed therebetween, and a second switch element having one terminal connected to the second node and another terminal connected to the ground with the third impedance circuit interposed therebetween, and may connect, by conduction and non-conduction of the first switch element and the second switch element being exclusively switched, only one of the first node and the second node to the ground with the third impedance circuit interposed therebetween.

With this configuration, by the first switch element and the second switch element sharing the third impedance circuit, the number thereof can be reduced, and the demultiplexing circuit can thus be reduced in size. Accordingly, the multiplexer can also be reduced in size as a whole.

Furthermore, the multiplexer may further include a third filter configured to allow a radio frequency signal in a third frequency band at least partially overlapping with the first frequency band and the second frequency band to pass therethrough, the demultiplexing circuit may further include a third individual terminal connected to the third filter, and a fifth impedance circuit provided in series on a third path connecting the first common terminal and the third individual terminal, and the switch circuit may connect others excluding any one of the first node, the second node, and a third node on the third path between the fifth impedance circuit and the third individual terminal to the ground with the third impedance circuit interposed therebetween.

With this, in the multiplexer supporting three frequency bands as well, it is possible to reduce the loss in the pass band while securing the isolation.

Furthermore, a plurality of sets constituted of the demultiplexing circuit, the first filter, and the second filter may be included, and a matching circuit may further be included, a frequency band including the first frequency band and the second frequency band in a first set among the plurality of sets may be higher in frequency than a frequency band including the first frequency band and the second frequency band in a second set among the plurality of sets, the matching circuit may include a second common terminal to which the first common terminal included in the first set and the first common terminal included in the second set are commonly connected, a fifth capacitor provided in series on a fourth path connecting the second common terminal and the first common terminal included in the first set, a third switch element connected between a node on the fourth path between the fifth capacitor and the first common terminal included in the first set and the ground, a third inductor provided in series on a fifth path connecting the second common terminal and the first common terminal included in the second set, and a fourth switch element connected between a node on the fifth path between the third inductor and the first common terminal included in the second set and the ground.

In this manner, a plurality of sets constituted of the demultiplexing circuit, the first filter, and the second filter is included, and the matching circuit is further included. With this configuration, by appropriately adjusting impedance viewed from the second common terminal when the third switch element is on and impedance viewed from the second common terminal when the third switch element is off, the following effects can be obtained. That is, both at the time of a CA (Carrier-Aggregation) operation with the first frequency band or the second frequency band in the first set and the first frequency band or the second frequency band in the second set and at the time of a non-CA operation with the first frequency band or the second frequency band in the first set or the first frequency band or the second frequency band in the second set, it is possible to reduce the loss in the pass band while securing the isolation.

Furthermore, a radio frequency front-end circuit according to an aspect of the present disclosure includes: the multiplexer according to any one of those described above; and an amplification circuit connected to the multiplexer.

According to the radio frequency front-end circuit as described above, by including the multiplexer in which the loss is reduced in the pass band, communication quality can be improved.

Furthermore, a communication device according to an aspect of the present disclosure includes: the above-mentioned radio frequency front-end circuit; and an RF signal processing circuit for performing signal processing on at least one of a radio frequency signal to be output to the radio frequency front-end circuit and a radio frequency signal input from the radio frequency front-end circuit, in which the RF signal processing circuit further switches connection by the switch circuit.

According to the communication device as described above, by including the multiplexer in which the loss is reduced in the pass band, communication quality can be improved.

According to the present disclosure, in a multiplexer, and a radio frequency front-end circuit and a communication device including the same, it is possible to reduce loss in a pass band while securing isolation.

DETAILED DESCRIPTION

Figure 1:
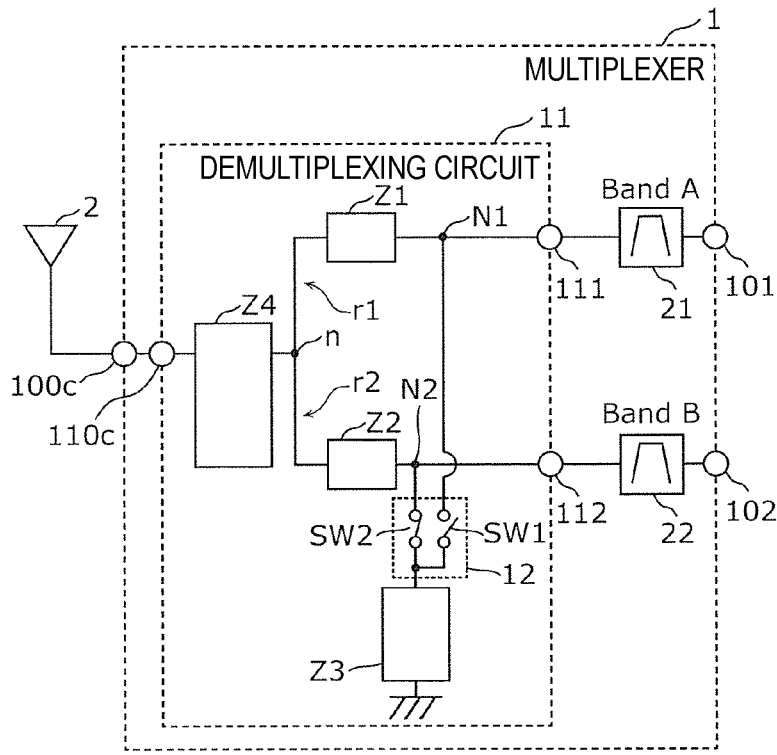
FIG. 1 is a diagram illustrating a configuration of a multiplexer according to a first embodiment.

Hereinafter, a multiplexer or the like according to embodiments of the present disclosure will be described in detail with reference to the drawings. Note that all embodiments described below indicate comprehensive or specific examples. Numerical values, shapes, materials, constituent elements, arrangement and connection forms of the constituent elements, and the like, which will be described in the following embodiments, are examples, and are not intended to limit the present disclosure. Constituent elements which are not described in independent claims among the constituent elements in the following embodiments are described as arbitrary constituent elements. In addition, sizes or size ratios of the constituent elements illustrated in the drawings are not necessarily strict. In addition, in the drawings, configurations that are substantially identical are given identical reference numerals, and redundant descriptions thereof will be omitted or simplified. In addition, an element value of a circuit element such as a capacitor, an inductor, and the like may be appropriately adjusted in accordance with a required specification.

First Embodiment

[1. Multiplexer Overall Configuration]

FIG. 1 is a diagram illustrating a configuration of a multiplexer 1 according to a first embodiment. Note that in the diagram, an antenna element 2 connected to the multiplexer 1 is also illustrated.

The multiplexer 1 supports a plurality of bands in which frequency bands at least partially overlap, and transmits a radio frequency signal of any one band of the plurality of bands in accordance with a control signal from a control unit (not illustrated) such as an RFIC (Radio Frequency Integrated Circuit) or the like. In the present embodiment, the multiplexer 1 is a multiplexer for reception supporting two bands of Band A and Band B.

For example, Band A and Band B are bands each of which includes at least one of 699-960 MHz, 1.2-2.7 GHz, and 3.3-5 GHz in the pass band.

Note that the multiplexer 1 is not limited to the multiplexer for reception, may be a multiplexer for transmission. For this reason, depending on a use mode of the multiplexer 1, there are cases where an input terminal to be described later serves as an output terminal, and an output terminal to be described later serves as an input terminal. Additionally, the multiplexer 1 may be used as a combiner for multiplexing radio frequency signals amplified by an amplification circuit or the like and outputting the resulting signal to the RFIC or the like.

Specifically, the multiplexer 1 includes an input terminal 100c connected to the antenna element 2, an output terminal 101 for Band A, and an output terminal 102 for Band B. Additionally, the multiplexer 1 further includes a demultiplexing circuit 11, a filter 21 for Band A, and a filter 22 for Band B.

The demultiplexing circuit 11 includes a common terminal 110c which is an example of a first common terminal, an individual terminal 111 which is an example of a first individual terminal, and an individual terminal 112 which is an example of a second individual terminal. This demultiplexing circuit 11 is a selection circuit that selectively outputs a radio frequency signal input to the common terminal 110c from any one of the individual terminals 111 and 112 in accordance with the control signal from the control unit (not illustrated). That is, the demultiplexing circuit 11 plays a function as a switch circuit by which a terminal for outputting a radio frequency signal is switched in accordance with the control signal. Note that details of the demultiplexing circuit 11 will be described later.

The filter 21 is an example of a first filter that allows a radio frequency signal in a first frequency band to pass therethrough, and in the present embodiment, allows a radio frequency signal of Band A to pass therethrough. The filter 22 is an example of a second filter that allows a radio frequency signal in a second frequency band to pass therethrough, and in the present embodiment, allows a radio frequency signal of Band B to pass therethrough. The configuration of each of the filters 21 and 22 is not particularly limited, but for example, an acoustic wave filter, an LC filter, a dielectric filter, or the like is used.

Here, frequency bands of Band A and Band B partially overlap with each other, and in the present embodiment, one frequency band includes the other frequency band. Note that the frequency relationship between Band A and Band B is not limited to this, and for example, a higher-band portion of one frequency band and a lower-band portion of the other frequency band may overlap with each other.

Furthermore, a radio frequency signal that may be input to the demultiplexing circuit 11 and a radio frequency signal that may be output from the demultiplexing circuit 11 are each a wide-band radio frequency signal including Band A and Band B. Accordingly, by filtering a radio frequency signal output from the individual terminal 111 of the demultiplexing circuit 11 by the filter 21, the multiplexer 1 outputs a radio frequency signal of Band A from the output terminal 101. On the other hand, by filtering a radio frequency signal output from the individual terminal 112 of the demultiplexing circuit 11 by the filter 22, the multiplexer 1 outputs a radio frequency signal of Band B from the output terminal 102. That is, the multiplexer 1 can switch between a first state in which the radio frequency signal of Band A is output from the output terminal 101 and a second state in which the radio frequency signal of Band B is output from the output terminal 102 in accordance with the control signal.

[2. Details of Demultiplexing Circuit]

Next, details of the demultiplexing circuit 11 will be described.

The demultiplexing circuit 11 further includes impedance circuits Z1 to Z3 and a switch circuit 12. In addition, in the present embodiment, the demultiplexing circuit 11 further includes an impedance circuit Z4.

The impedance circuit Z1 is a first impedance circuit provided in series on a path r1 which is a first path connecting the common terminal 110c and the individual terminal 111. Specifically, the impedance circuit Z1 is provided on the path r1 between a branch point n, which will be described later, and the individual terminal 111. The impedance circuit Z2 is a second impedance circuit provided in series on a path r2 which is a second path connecting the common terminal 110c and the individual terminal 112. Specifically, the impedance circuit Z2 is provided on the path r2 between the branch point n and the individual terminal 112. The impedance circuit Z3 is a third impedance circuit provided in series on a path connecting the path r1 and the ground and on a path connecting the path r2 and the ground. Here, the paths r1 and r2 are made common from the common terminal 110c to the branch point n. The impedance circuit Z4 is a fourth impedance circuit provided in a common connection portion in which the path r1 and the path r2 are made common. That is, the impedance circuit Z4 is provided between the branch point n of the paths r1 and r2 and the common terminal 110c.

The switch circuit 12 is connected to the impedance circuit Z3 and switches a node connected to the ground with the impedance circuit Z3 interposed therebetween. Specifically, the switch circuit 12 connects any one of a node N1 on the path r1 and a node N2 on the path r2 to the ground with the impedance circuit Z3 interposed therebetween. Here, the node N1 is a first node on the path r1 between the impedance circuit Z1 and the individual terminal 111. The node N2 is a second node on the path r2 between the impedance circuit Z2 and the individual terminal 112.

In the present embodiment, the switch circuit 12 is connected between the impedance circuit Z3 and the nodes N1 and N2. Specifically, the switch circuit 12 includes an SPST (Single-Pole Single-Throw) type switch SW1 which is an example of a first switch element for switching between conduction and non-conduction between the impedance circuit Z3 and the node N1, and an SPST type switch SW2 which is an example of a second switch element for switching between conduction and non-conduction between the impedance circuit Z3 and the node N2. These switches SW1 and SW2 connect, by conduction (ON) and non-conduction (OFF) thereof being exclusively switched, any one of the nodes N1 and N2 to the ground with the impedance circuit Z3 interposed therebetween.

Note that the switch circuit 12 is not limited to the above configuration, and may be configured, for example, by an SPDT (Single-Pole Double-Throw) type switch in which the common terminal is connected to the ground with the impedance circuit Z3 interposed therebetween and the two individual terminals are respectively connected to the nodes N1 and N2.

In the present embodiment, the path r1 and the path r2 are connected to each other at the branch point n, and are connected to the common terminal 110c. Note that the path r1 and the path r2 are not limited to this configuration, and may be individually connected to the common terminal 110c. That is, the common terminal 110c and the branch point n may coincide with each other. In this case, the impedance circuit Z4 is constituted by a circuit element disposed on a path connecting the common terminal 110c and the ground. As such a circuit element, for example, an inductor or the like in which one terminal is connected to a common connection point and the other terminal is connected to the ground can be used.

Impedances of the common terminal 110c and the individual terminals 111 and 112 of the demultiplexing circuit 11 configured as described above are adjusted by the impedance circuits Z1 to Z4 so as to satisfy the following.

When the node N2 is connected to the ground with the impedance circuit Z3 interposed therebetween by the switch circuit 12, the impedance of the demultiplexing circuit 11 at the individual terminal 111 is substantially equal to the normalized impedance such as 50Ω or the like in Band A. Furthermore, in this case, the impedance of the demultiplexing circuit 11 at the individual terminal 112 is substantially equal to 0Ω or infinity in Band B. On the other hand, when the node N1 is connected to the ground with the impedance circuit Z3 interposed therebetween by the switch circuit 12, the impedance of the demultiplexing circuit 11 at the individual terminal 112 is substantially equal to the normalized impedance in Band B. Furthermore, in this case, the impedance of the demultiplexing circuit 11 at the individual terminal 111 is substantially equal to 0Ω or infinity in Band A.

In other words, the impedance circuits Z1 to Z4 play the following functions.

When the demultiplexing circuit 11 outputs a radio frequency signal from the individual terminal 111, the impedance circuit Z1 brings the impedance of the demultiplexing circuit 11 at the individual terminal 111 close to the normalized impedance in Band A. When the demultiplexing circuit 11 outputs a radio frequency signal from the individual terminal 112, the impedance circuit Z2 brings the impedance of the demultiplexing circuit 11 at the individual terminal 112 close to the normalized impedance in Band B. When the demultiplexing circuit 11 outputs a radio frequency signal from the individual terminal 111, the impedance circuit Z3 brings the impedance of the demultiplexing circuit 11 at the individual terminal 112 close to 0Ω or infinity in Band A. On the other hand, when the demultiplexing circuit 11 outputs a radio frequency signal from the individual terminal 112, the impedance circuit Z3 brings the impedance of the demultiplexing circuit 11 at the individual terminal 111 close to 0Ω or infinity in Band B. The impedance circuit Z4 brings the impedance of the demultiplexing circuit at the common terminal 110c close to the normalized impedance in Band A and Band B.

These matters about the impedance of the demultiplexing circuit 11 will be described later using a working example, together with the detailed configurations of the impedance circuits Z1 to Z4.

Note that the expression "the impedance is substantially equal" includes not only being completely equal but also being substantially equal. Furthermore, the expression "the impedance is substantially equal in one frequency band" includes not only that the impedance is substantially equal over the whole of the one frequency band, but also that the impedance is substantially equal at least in part of the frequency band.

Furthermore, "the normalized impedance" is not limited 50Ω, and may be substantially equal to the impedance of a transmission system of the multiplexer 1. That is, the characteristic impedance of a transmission line constituting the multiplexer 1 and the characteristic impedance of a transmission line connected to the multiplexer 1 are not limited to 50Ω.

Furthermore, "the normalized impedance" is not limited to impedance substantially equal to the impedance of the transmission system, and may be "impedance matched with circuits connected before and after the demultiplexing circuit 11". For example, when an input impedance (that is, impedance at a terminal on the demultiplexing circuit 11 side) of the filter 21 differs from 50Ω in Band A, the normalized impedance at the individual terminal 111 may be impedance such that a complex conjugate relationship with the input impedance is established in Band A. Furthermore, for example, when an input impedance of the filter 22 differs from 50Ω in Band B, the normalized impedance at the individual terminal 112 may be impedance such that a complex conjugate relationship with the input impedance is established in Band B. Note that the complex conjugate relationship may be a relationship such that a complex component is canceled.

[3. Working Examples]

Hereinafter, the detailed configuration and characteristics of the demultiplexing circuit 11 will be described using a working example which is an example of the present embodiment.

[3-1. Configuration]

Figure 2:
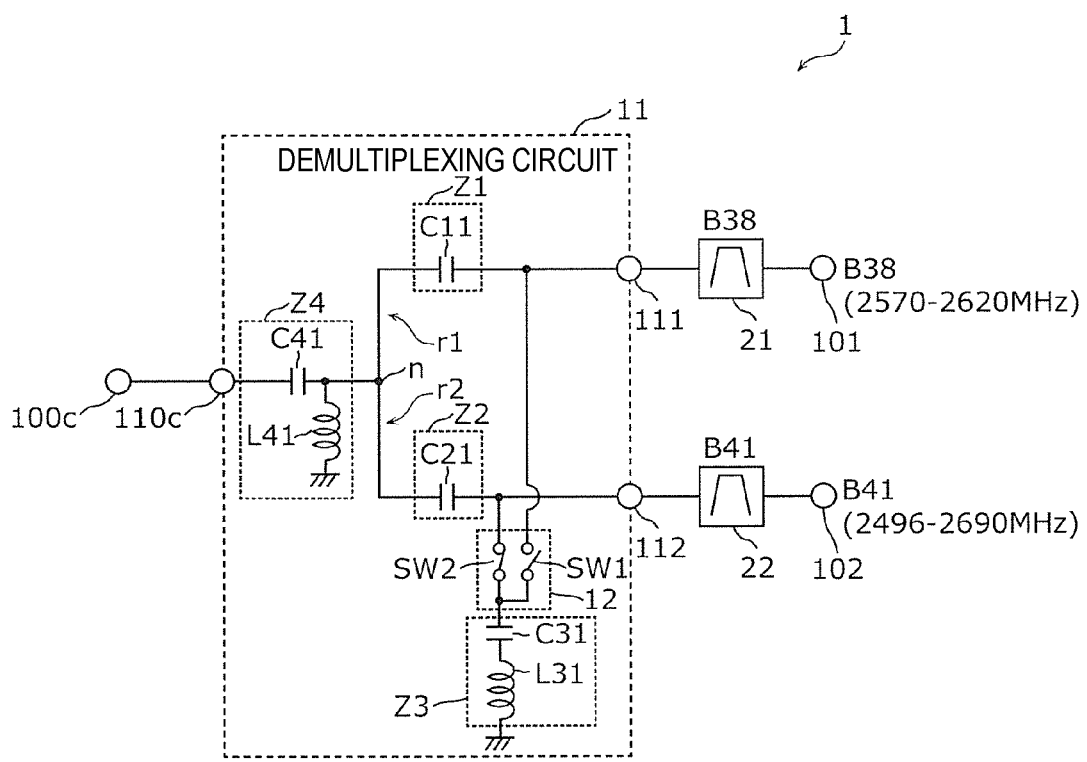
FIG. 2 is a diagram illustrating a configuration of a demultiplexing circuit according to a working example.

FIG. 2 is a diagram illustrating the configuration of the demultiplexing circuit 11 according to the working example. Note that the diagram also illustrates the filters 21 and 22 and the like in the periphery of the demultiplexing circuit 11.

The demultiplexing circuit 11 according to the present working example outputs a radio frequency signal of an HB2 band (2496-2690 MHz) input to the common terminal 110c, from any one of the individual terminals 111 and 112. Furthermore, the filter 21 according to the present working example allows a radio frequency signal of Band 38 (2570-2620 MHz) included in the HB2 band to pass therethrough. Furthermore, the filter 22 according to the present working example allows a radio frequency signal of Band 41 (2496-2690 MHz) included in the HB2 band to pass therethrough.

That is, in the present working example, the individual terminal 111 of the demultiplexing circuit 11 is an individual terminal for Band 38 which is connected to the filter 21 for Band 38. Furthermore, the individual terminal 112 of the demultiplexing circuit 11 is an individual terminal for Band 41 which is connected to the filter 22 for Band 41.

Note that in the diagram, for example, "Band 38" is represented by B and a number subsequent thereto, as in "B38". This also applies, in the same manner, to the diagrams given hereinafter.

Furthermore, in the demultiplexing circuit 11 according to the working example, the impedance circuit Z1 is a capacitor C11 which is an example of a first capacitor provided in series on the path r1. Furthermore, the impedance circuit Z2 is a capacitor C21 which is an example of a second capacitor provided in series on the path r2. Furthermore, the impedance circuit Z3 is an LC series resonance circuit in which an inductor L31 which is an example of a first inductor and a capacitor C31 which is an example of a third capacitor are connected in series. This impedance circuit Z3 has a resonant frequency in which the impedance is minimized in or in the vicinity of the frequency band in which Band 38 and Band 41 overlap with each other. Furthermore, the impedance circuit Z4 includes a capacitor C41 which is an example of a fourth capacitor provided in series in the common connection portion of the path r1 and the path r2, and an inductor L41 which is an example of a second inductor connected between the node of the common connection portion and the ground.

Figure 3:
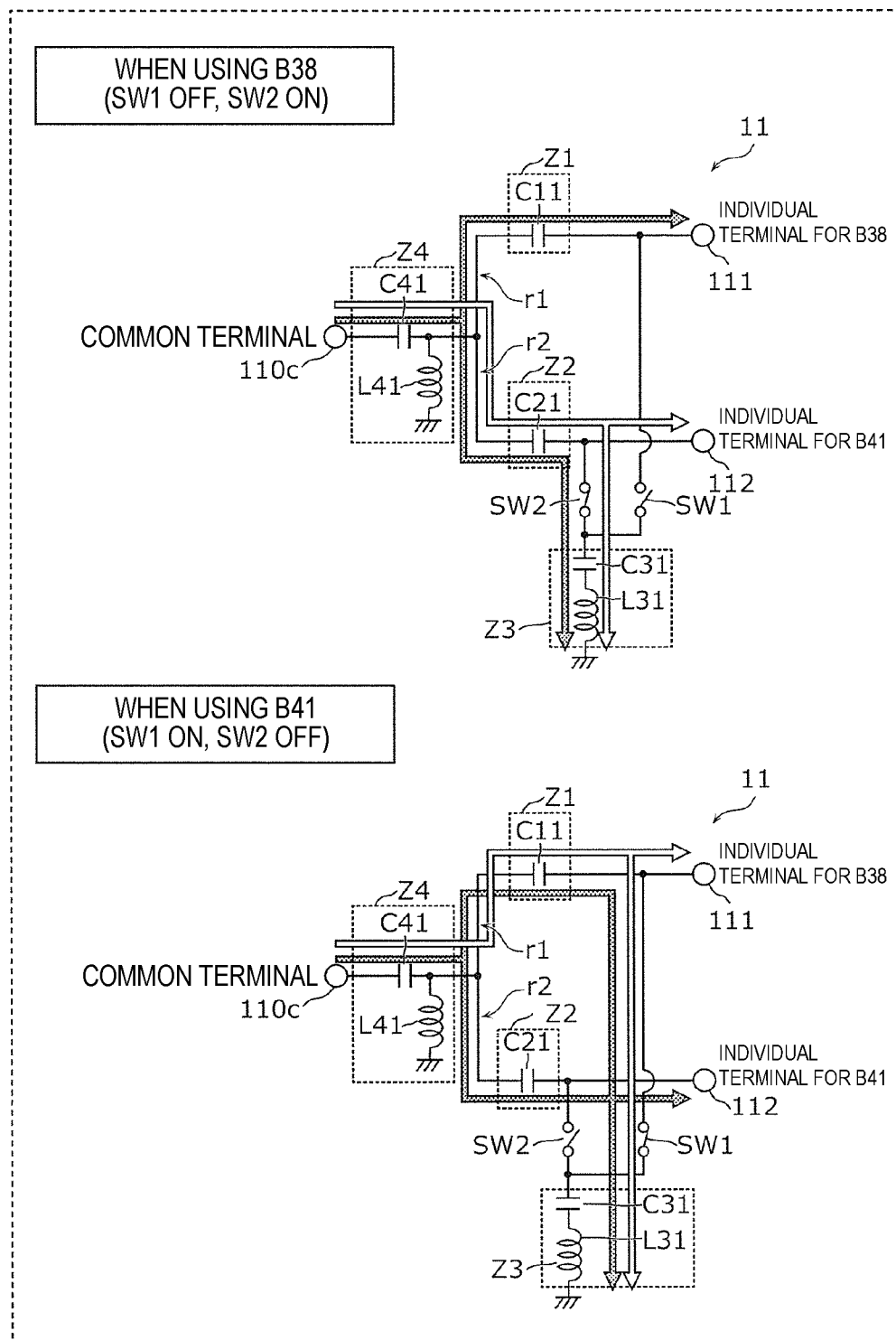
FIG. 3 includes diagrams illustrating two states in which on and off of switches are different in the demultiplexing circuit according to the working example.

FIG. 3 includes diagrams illustrating two states in which on and off of the switch SW1 and the switch SW2 are different in the demultiplexing circuit 11 according to the working example. Specifically, in the upper part of the diagrams, a circuit diagram in a case where the switch SW1 is off and the switch SW2 is on is illustrated. In the lower part of the diagrams, a circuit diagram in a case where the switch SW1 is on and the switch SW2 is off is illustrated. Here, in the case where the switch SW1 is off and the switch SW2 is on, the filter 21 for Band 38 is used. On the other hand, in the case where the switch SW1 is on and the switch SW2 is off, the filter 22 for Band 41 is used. Note that the diagrams also schematically illustrate a radio frequency signal flowing through the demultiplexing circuit 11.

First, the case where the switch SW1 is off and the switch SW2 is on will be described with reference to the upper part of the diagrams.

In this case, on the path r1 connecting the common terminal 110c and the individual terminal 111 for Band 38, the impedance circuit Z1 and the impedance circuit Z4 are located. On the other hand, on the path connecting the path r1 and the ground, the impedance circuit Z2 and the impedance circuit Z3 are located. That is, composite characteristics of the impedance circuits Z1 and Z4 are given to a serial arm which is a main path for transmitting a radio frequency signal to the individual terminal 111. On the other hand, composite characteristics of the impedance circuits Z2 and Z3 are given to a parallel arm connecting the serial arm and the ground.

Furthermore, in this case, on the path r2 connecting the common terminal 110c and the individual terminal 112 for Band 41, the impedance circuit Z2 and the impedance circuit Z4 are located. On the other hand, on the path connecting the path r2 and the ground, the impedance circuit Z3 is located. That is, composite characteristics of the impedance circuits Z2 and Z4 are given to a serial arm which is a main path for transmitting a radio frequency signal to the individual terminal 112. On the other hand, characteristics of the impedance circuit Z3 are given to a parallel arm connecting the serial arm and the ground.

Next, the case where the switch SW1 is on and the switch SW2 is off will be described with reference to the lower part of the diagrams.

In this case, on the path r2 connecting the common terminal 110c and the individual terminal 112 for Band 41, the impedance circuit Z2 and the impedance circuit Z4 are located. On the other hand, on the path connecting the path r2 and the ground, the impedance circuit Z1 and the impedance circuit Z3 are located. That is, composite characteristics of the impedance circuits Z2 and Z4 are given to a serial arm which is a main path for transmitting a radio frequency signal to the individual terminal 112. On the other hand, composite characteristics of the impedance circuits Z1 and Z3 are given to a parallel arm connecting the serial arm and the ground.

Furthermore, in this case, on the path r1 connecting the common terminal 110c and the individual terminal 111 for Band 38, the impedance circuit Z1 and the impedance circuit Z4 are located. On the other hand, on the path connecting the path r1 and the ground, the impedance circuit Z3 is located. That is, composite characteristics of the impedance circuits Z1 and Z4 are given to a serial arm which is a main path for transmitting a radio frequency signal to the individual terminal 111. On the other hand, characteristics of the impedance circuit Z3 are given to a parallel arm connecting the serial arm and the ground.

Figure 4:
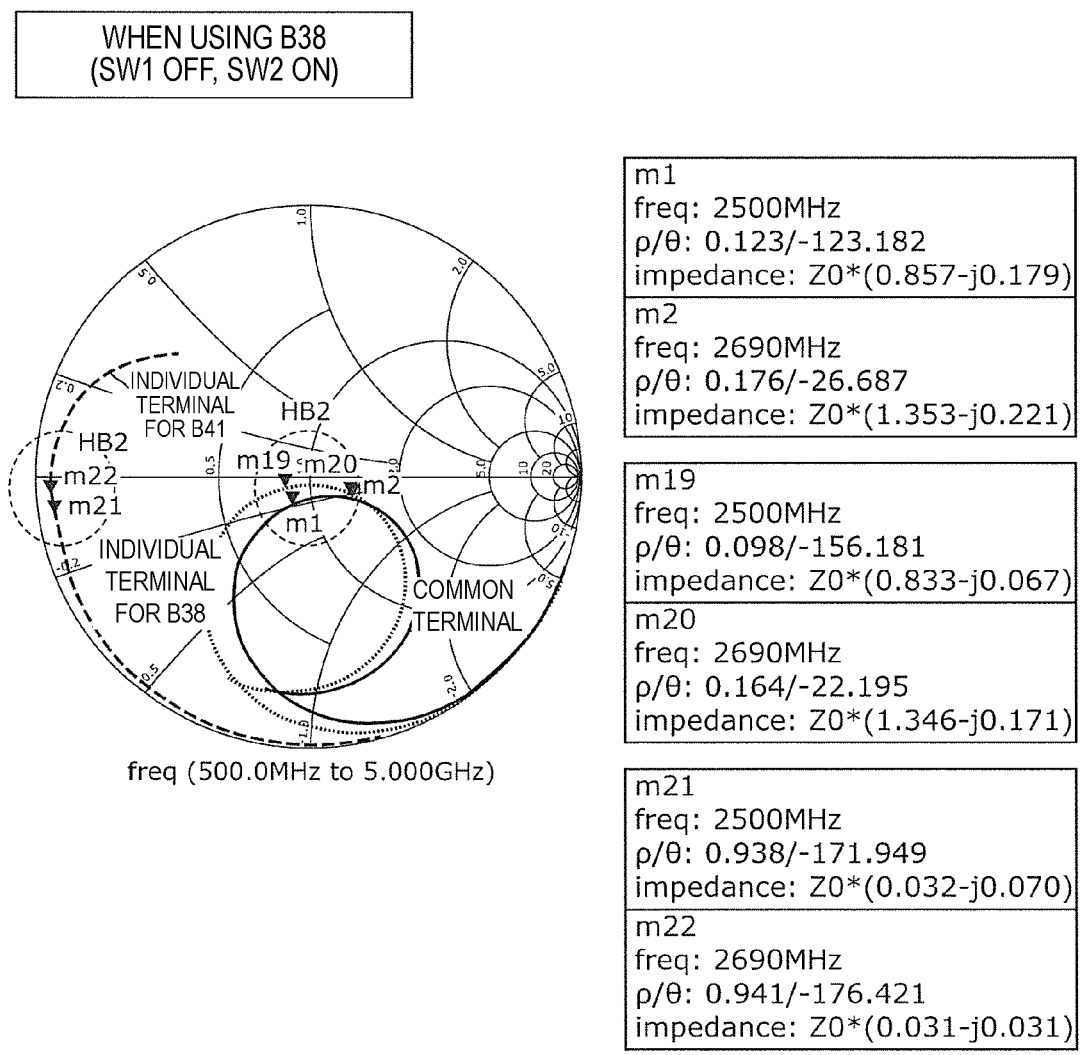
FIG. 4 is a Smith chart showing impedance characteristics of the demultiplexing circuit in a case where one switch is off and the other switch is on in the working example.
Figure 5:
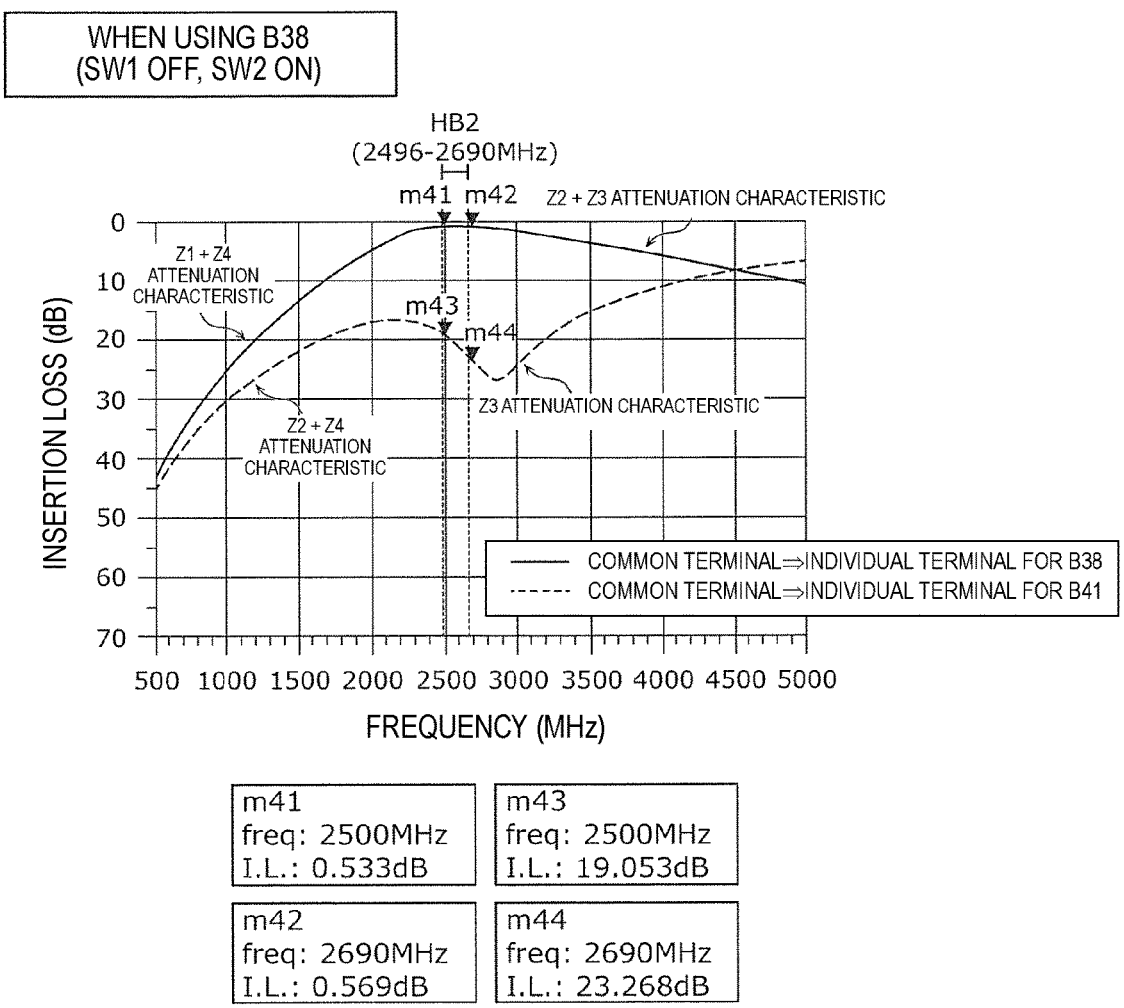
FIG. 5 is a graph showing bandpass characteristics of the demultiplexing circuit in the case where one switch is off and the other switch is on in the working example.
Figure 6:
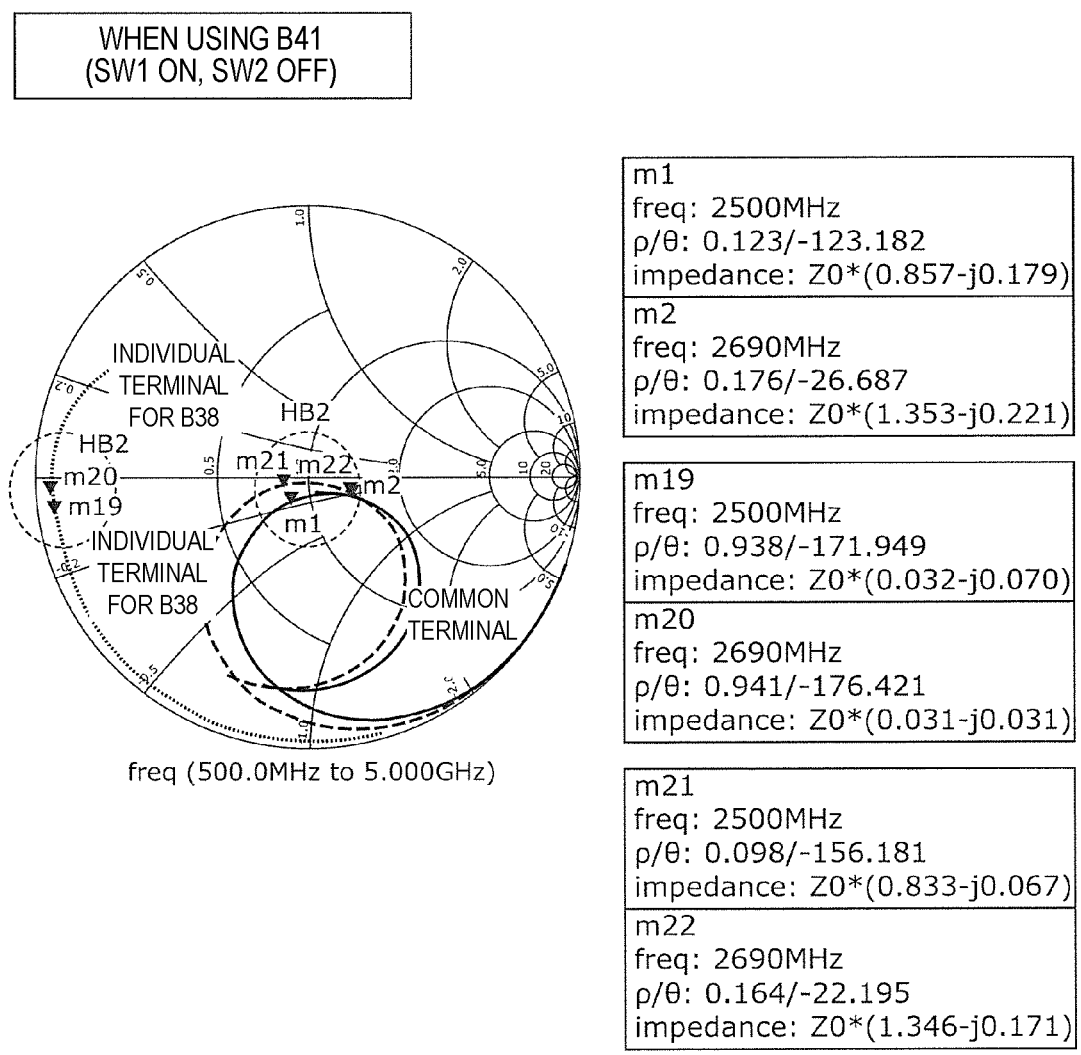
FIG. 6 is a Smith chart showing impedance characteristics of the demultiplexing circuit in a case where one switch is on and the other switch is off in the working example.
Figure 7:
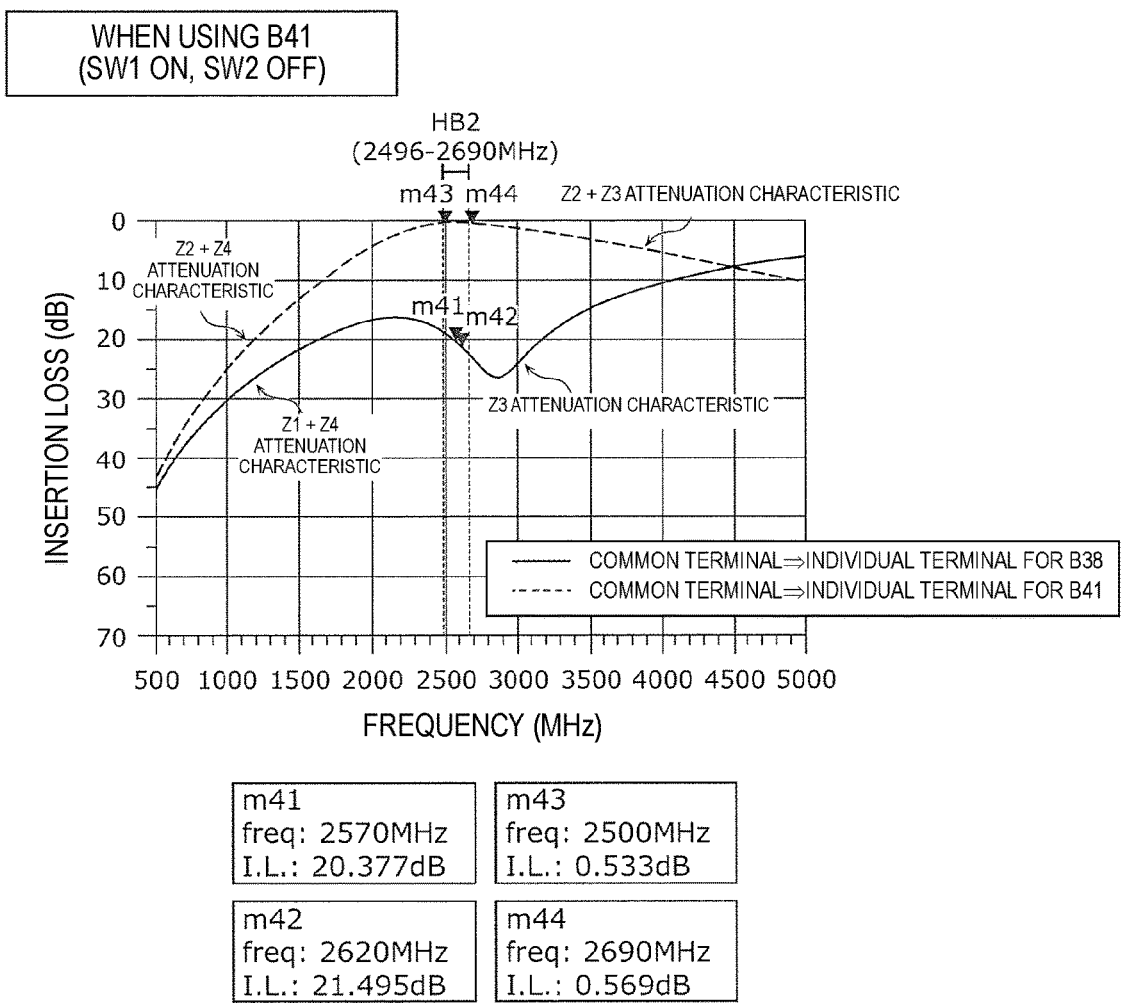
FIG. 7 is a graph showing bandpass characteristics of the demultiplexing circuit in the case where one switch is on and the other switch is off in the working example.

Accordingly, the demultiplexing circuit 11 has characteristics illustrated in FIG. 4 and FIG. 5 in the case where the switch SW1 is off and the switch SW2 is on, and has characteristics illustrated in FIG. 6 and FIG. 7 in the case where the switch SW1 is on and the switch SW2 is off. Hereinafter, these characteristics will be specifically described.

Note that in a Smith chart showing impedance characteristics and a graph showing bandpass characteristics which are described below, a marker is added in the vicinity of the low band end and in the vicinity of the high band end of the HB2 band. Furthermore, on the right side of the Smith chart showing the impedance characteristics, a frequency, a magnitude $\rho$ and a phase $\theta$ of a reflection coefficient $\Gamma$, and impedance (a coefficient Z0 is, for example, 50Ω), at a marker m* (here, * is a numerical value following m in the graph) in the graph, are shown. Furthermore, the frequency and Insertion Loss (I. L.) at the marker m* in the graph are shown below the graph indicating the bandpass characteristics. This also applies, in the same manner, to markers of Smith charts showing impedance characteristics and graphs showing bandpass characteristics given hereinafter.

[3-2. Characteristics]

[3-2-1. Case where Switch SW1 is Off and Switch SW2 is On]

First, with reference to FIG. 4 and FIG. 5, the case where the switch SW1 is off and the switch SW2 is on will be described.

FIG. 4 is a Smith chart showing impedance characteristics of the demultiplexing circuit 11 in the case where the switch SW1 is off and the switch SW2 is on in the present working example. FIG. 5 is a graph showing bandpass characteristics of the demultiplexing circuit 11 in the case where the switch SW1 is off and the switch SW2 is on in the present working example. Specifically, in the diagram, insertion loss between the common terminal 110c and the individual terminal 111 for Band 38 and insertion loss between the common terminal 110c and the individual terminal 112 for Band 41 are shown. This also applies, in the same manner, to graphs given hereinafter showing bandpass characteristics of the demultiplexing circuit.

As is apparent from FIG. 4, in a case where the switch SW1 is off and the switch SW2 is on, impedance of the common terminal 110c in the HB2 band and impedance of the individual terminal 111 for Band 38 in the HB2 band are close to 50Ω. On the other hand, impedance of the individual terminal 112 for Band 41 in the HB2 band is close to 0Ω.

With this, in this case, as shown in FIG. 5, the radio frequency signal in the HB2 band input to the common terminal 110c is output from the individual terminal 111 for Band 38 with low loss, and is hardly output from the individual terminal 112 for Band 41.

Specifically, the insertion loss between the common terminal 110c and the individual terminal 111 for Band 38 takes the following values in the HB2 band. That is, when Band 38 is used, the radio frequency signal of the HB2 band output to the individual terminal 111 for Band 38 is reduced in loss.

Vicinity of HB2 band low band end: 0.533 dB
Vicinity of HB2 band high band end: 0.569 dB Furthermore, the radio frequency signal output to the individual terminal 111 for Band 38 is attenuated on the lower band side than the HB2 band due to the influence of the attenuation characteristics by the synthesis circuit of the impedance circuits Z1 and Z4. That is, the radio frequency signal is attenuated on the lower band side than the HB2 band, by the capacitor C11 included in the impedance circuit Z1, and a high pass filter circuit constituted of the capacitor C41 and the inductor L41 included in the impedance circuit Z4.

Furthermore, the radio frequency signal is attenuated on the higher band side than the HB2 band due to the influence of the attenuation characteristics by the synthesis circuit of the impedance circuits Z2 and Z3. That is, the radio frequency signal is attenuated on the higher band side than the HB2 band, by the capacitor C21 included in the impedance circuit Z2, and the LC series resonance circuit constituted of the capacitor C31 and the inductor L31 included in the impedance circuit Z3.

In contrast, the insertion loss between the common terminal 110c and the individual terminal 112 for Band 41 takes the following values in the HB2 band. That is, when Band 38 is used, almost no radio frequency signal of the HB2 band is output to the individual terminal 112 for Band 41.

Vicinity of HB2 band low band end: 19.053 dB
Vicinity of HB2 band high band end: 23.268 dB This is due to the influence of the attenuation characteristics of the impedance circuit Z3 which imparts characteristics to the parallel arm of the individual terminal 112 for Band 41.

Furthermore, the radio frequency signal output to the individual terminal 112 for Band 41 is attenuated on the lower band side than the HB2 band due to the influence of the attenuation characteristics by the synthesis circuit of the impedance circuits Z2 and Z4. That is, the radio frequency signal is attenuated on the lower band side than the HB2 band, by the capacitor C21 included in the impedance circuit Z2, and a high pass filter circuit constituted of the capacitor C41 and the inductor L41 included in the impedance circuit Z4.

[3-2-2. Case where Switch SW1 is On and Switch SW2 is Off]

Next, with reference to FIG. 6 and FIG. 7, the case where the switch SW1 is on and the switch SW2 is off will be described.

Here, in the present working example, the impedance circuit Z1 and the impedance circuit Z2 have the same circuit configuration formed by the circuit elements having the same element value. That is, the capacitance value of the capacitor C11 and the capacitance value of the capacitor C21 are equal to each other. For this reason, when the case where the switch SW1 is off and the switch SW2 is on and the case where the switch SW1 is on and the switch SW2 is off are compared, the difference is that the characteristics of the individual terminals 111 and 112 and a matter relating thereto are interchanged. Accordingly, the characteristics will be described below in a simplified manner.

FIG. 6 is a Smith chart showing impedance characteristics of the demultiplexing circuit 11 in the case where the switch SW1 is on and the switch SW2 is off in the present working example. FIG. 7 is a graph showing bandpass characteristics of the demultiplexing circuit 11 in the case where the switch SW1 is on and the switch SW2 is off in the present working example. Specifically, in the diagram, insertion loss between the common terminal 110c and the individual terminal 111 for Band 38 and insertion loss between the common terminal 110c and the individual terminal 112 for Band 41 are shown.

As is apparent from FIG. 6, in the impedance characteristics in the case where the switch SW1 is on and the switch SW2 is off, in comparison with the impedance characteristics shown in FIG. 4, the impedance at the individual terminal 111 and the impedance at the individual terminal 112 are interchanged.

With this, in this case, as shown in FIG. 7, the radio frequency signal in the HB2 band input to the common terminal 110c is output from the individual terminal 112 for Band 41 with low loss, and is hardly output from the individual terminal 111 for Band 38. That is, the bandpass characteristics shown in FIG. 7 indicates characteristics in which the bandpass characteristics shown in FIG. 5 are interchanged.

Specifically, when Band 41 is used, the radio frequency signal of the HB2 band output to the individual terminal 112 for Band 41 is reduced in loss.

Here, the radio frequency signal output to the individual terminal 112 for Band 41 is attenuated on the lower band side than the HB2 band due to the influence of the attenuation characteristics by the synthesis circuit of the impedance circuits Z2 and Z4. Furthermore, the radio frequency signal is attenuated on the higher band side than the HB2 band due to the influence of the attenuation characteristics by the synthesis circuit of the impedance circuits Z1 and Z3.

In contrast, when Band 41 is used, almost no radio frequency signal of the HB2 band is output to the individual terminal 111 for Band 38. This is due to the influence of the attenuation characteristics of the impedance circuit Z3 which imparts characteristics to the parallel arm of the individual terminal 111 for Band 38.

Furthermore, the radio frequency signal output to the individual terminal 111 for Band 38 is attenuated on the lower band side than the HB2 band due to the influence of the attenuation characteristics by the synthesis circuit of the impedance circuits Z1 and Z4.

[4. Effects and Others]

Effects provided by the multiplexer 1 according to the present embodiment described above using the working example will be described in comparison with a comparative example.

Figure 8:
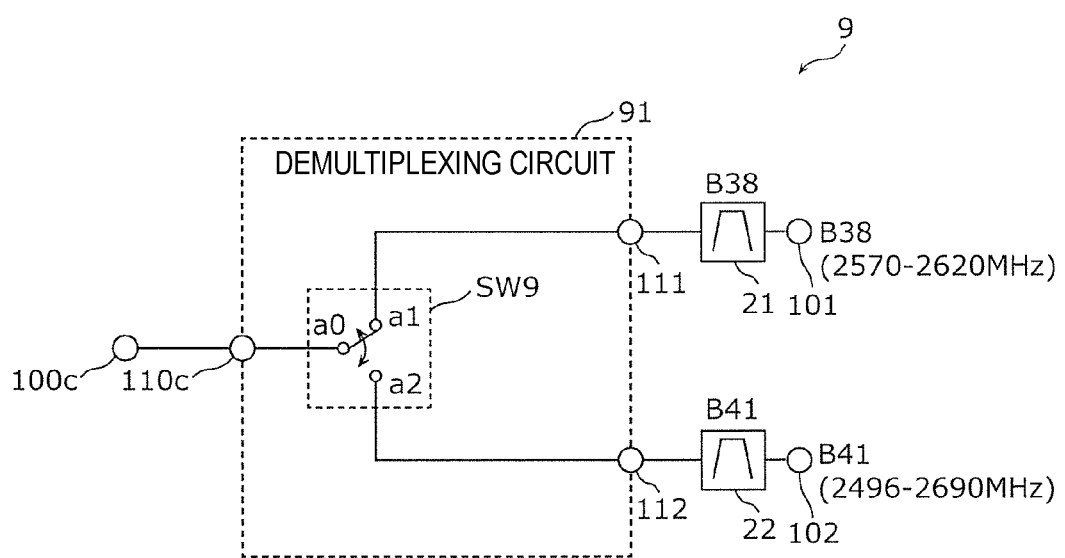
FIG. 8 is a diagram illustrating a configuration of a multiplexer according to a comparative example.

First, a multiplexer according to the comparative example will be described. FIG. 8 is a diagram illustrating a configuration of a multiplexer 9 according to the comparative example.

The multiplexer 9 illustrated in the diagram differs from the multiplexer 1 according to the working example in a point of including a demultiplexing circuit 91 having a switch SW9 instead of the demultiplexing circuit 11.

The switch SW9 is an SPDT type switch element, in which a common terminal a0 is connected to the common terminal 110c of the demultiplexing circuit 91, one selection terminal a1 is connected to the individual terminal 111 of the demultiplexing circuit 91, and the other selection terminal a2 is connected to the individual terminal 112 of the demultiplexing circuit 91.

The demultiplexing circuit 91 as described above outputs a radio frequency signal of the HB2 band input to the common terminal 110c from the individual terminal 111 or 112 by the switch SW9 being switched in accordance with a control signal. That is, the multiplexer 9 according to the comparative example can switch between a first state in which the radio frequency signal of Band 38 is output from the output terminal 101 and a second state in which the radio frequency signal of Band 41 is output from the output terminal 102 in accordance with the control signal. Here, in the first state, the filter 21 for Band 38 is used, whereas in the second state, the filter 22 for Band 41 is used.

Figure 9:
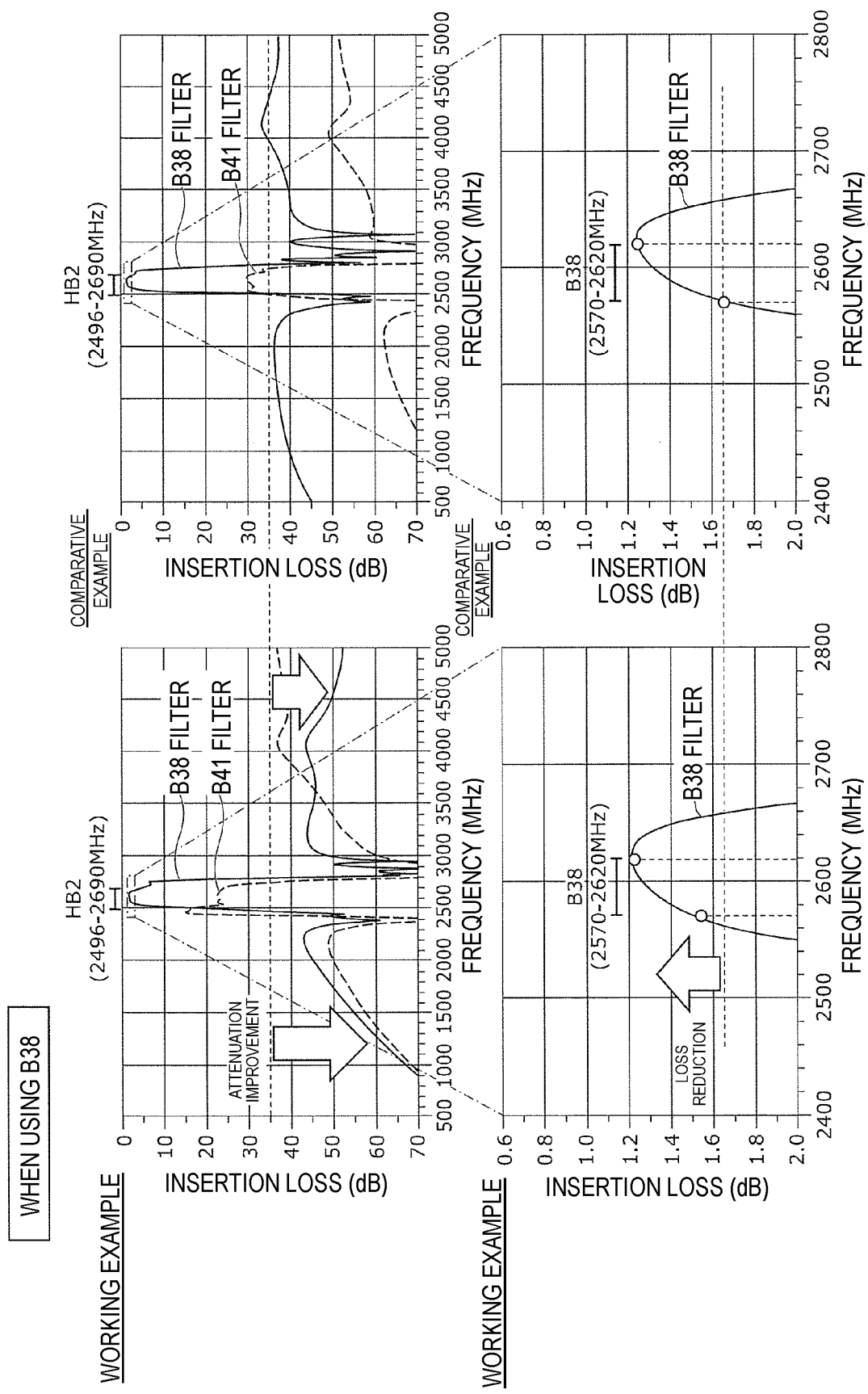
FIG. 9 includes graphs showing the bandpass characteristics of the multiplexer when using a filter for Band 38 by comparing the working example and the comparative example.
Figure 10:
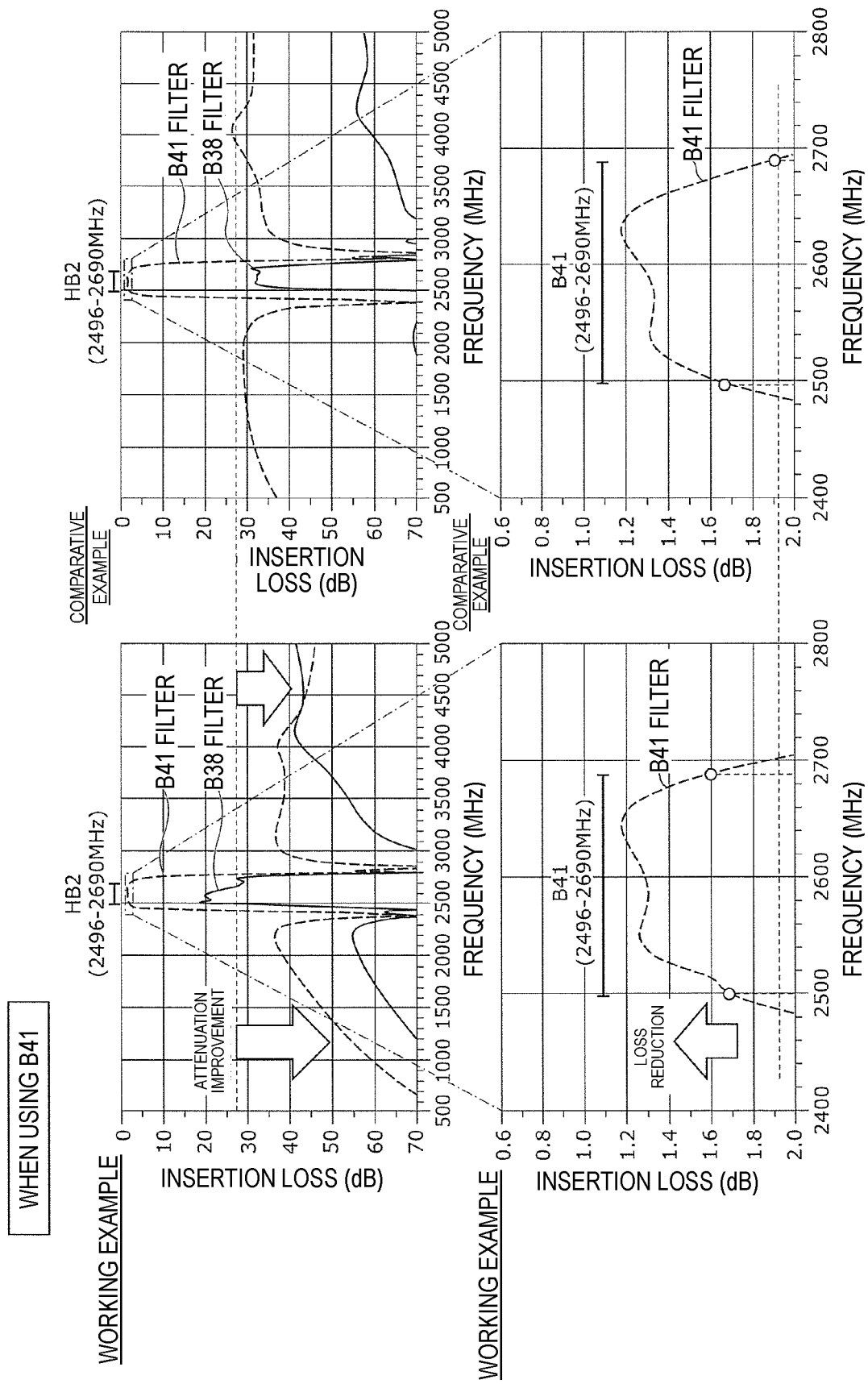
FIG. 10 includes graphs showing the bandpass characteristics of the multiplexer when using a filter for Band 41 by comparing the working example and the comparative example.

FIG. 9 includes graphs showing the bandpass characteristics of the multiplexer when using the filter 21 for Band 38 by comparing the working example and the comparative example. FIG. 10 includes graphs showing the bandpass characteristics of the multiplexer when using the filter 22 for Band 41 by comparing the working example and the comparative example. Specifically, the bandpass characteristics of the multiplexer 1 according to the working example are shown in the left column of these graphs, and the bandpass characteristics of the multiplexer 9 according to the comparative example are shown in the right column of these graphs. Furthermore, in the upper part of these graphs, the bandpass characteristics are shown as a whole, and in the lower part of these graphs, the characteristics, in the pass band and its periphery of the bandpass characteristics shown in the upper part, are shown in an enlarged manner.

As is apparent from these graphs, in the multiplexer 1 according to the working example, the insertion loss (that is, loss) in the pass band is reduced both when using the filter 21 for Band 38 (see FIG. 9) and when using the filter 22 for Band 41 (see FIG. 10), as compared to the multiplexer 9 according to the comparative example.

In other words, in the multiplexer 9 according to the comparative example, the terminals to which the radio frequency signal is output are switched by the switch SW9 provided on the main path connecting the input terminal 100c and the output terminals 101 and 102. Accordingly, since the output radio frequency signal is influenced by on-resistance of the switch SW9, the low loss in the pass band is prevented.

In contrast, according to the multiplexer 1 according to the working example, the individual terminals 111 and 112 to which the radio frequency signal is output are switched by the switch circuit 12 provided on the path connecting the main path and the ground. Accordingly, since the output radio frequency signal is less likely to be influenced by the on-resistance of the switch element constituting the switch circuit 12, the loss in the pass band is reduced both when using Band 38 and when using Band 41.

Furthermore, according to the multiplexer 1 according to the working example, by the influence of the attenuation characteristics by the synthesis circuit of the impedance circuits Z1 and Z4 and the influence of the attenuation characteristics by the synthesis circuit of the impedance circuits Z2 and Z4, it is possible to secure a greater attenuation on the lower band side than the HB2 band in comparison with the comparative example. Furthermore, according to the multiplexer 1 according to the working example, by the influence of the attenuation characteristics by the synthesis circuit of the impedance circuits Z1 and Z3 and the influence of the attenuation characteristics by the synthesis circuit of the impedance circuits Z2 and Z3, it is possible to secure a greater attenuation on the higher band side than the HB2 band in comparison with the comparative example. That is, according to the multiplexer 1 according to the working example, in comparison with the comparative example, the attenuation outside the pass band is improved both when using Band 38 and when using Band 41.

As described above, according to the multiplexer 1 according to the present embodiment described using the working example, the demultiplexing circuit 11 includes the impedance circuit Z1 provided in series on the path r1 connecting the common terminal 110c and the individual terminal 111, the impedance circuit Z2 provided in series on the path r2 connecting the common terminal 110c and the individual terminal 112, and the impedance circuit Z3 and the switch circuit 12. The switch circuit 12 connects only one of the node N1 on the path r1 between the impedance circuit Z1 and the individual terminal 111 and the node N2 on the path r2 between the impedance circuit Z2 and the individual terminal 112 to the ground with the impedance circuit Z3 interposed therebetween.

With the configuration as described above, by appropriately designing the impedance circuit Z1, the impedance circuit Z2, and the impedance circuit Z3, it is possible to reduce the loss in the pass band while securing isolation. Specifically, when the node N1 is connected to the ground with the impedance circuit Z3 interposed therebetween by the switch circuit 12, the demultiplexing circuit 11 can reduce the loss in the pass band, while securing isolation of the radio frequency signal output to the individual terminal 111 with the radio frequency signal output to the individual terminal 112. On the other hand, when the node N2 is connected to the ground with the impedance circuit Z3 interposed therebetween by the switch circuit 12, the demultiplexing circuit 11 can reduce the loss in the pass band, while securing isolation of the radio frequency signal output to the individual terminal 112 with the radio frequency signal output to the individual terminal 111. Accordingly, a multiplexer capable of reducing the loss in the pass band while securing the isolation can be obtained.

Furthermore, according to the multiplexer 1 according to the present embodiment, when the node N2 is connected to the ground with the impedance circuit Z3 interposed therebetween by the switch circuit 12, the impedance of the demultiplexing circuit 11 at the individual terminal 111 is substantially equal to the normalized impedance in the first frequency band (Band A, Band 38 in the working example). This makes it possible to suppress reflection loss of the radio frequency signal in the first frequency band due to mismatching at the individual terminal 111. Furthermore, in the above-mentioned case, the impedance of the demultiplexing circuit 11 at the individual terminal 112 is substantially equal to 0Ω or infinity in the second frequency band (Band B, Band 41 in the working example). This makes it possible to prevent the radio frequency signal in the second frequency band from passing through the individual terminal 112. That is, the radio frequency signal in the second frequency band that may pass through the individual terminal 112 can be attenuated. Accordingly, when the first frequency band is used, that is, when the radio frequency signal in the first frequency band is allowed to pass, it is possible to reduce the loss in the first frequency band and to increase the attenuation in the second frequency band.

Furthermore, according to the multiplexer 1 according to the present embodiment, when the node N1 is connected to the ground with the impedance circuit Z3 interposed therebetween by the switch circuit 12, the impedance of the demultiplexing circuit 11 at the individual terminal 112 is substantially equal to the normalized impedance in the second frequency band. This makes it possible to suppress reflection loss of the radio frequency signal in the second frequency band due to mismatching at the individual terminal 112. Furthermore, in the above-mentioned case, the impedance of the demultiplexing circuit 11 at the individual terminal 111 is substantially equal to 0Ω or infinity in the first frequency band. This makes it possible to prevent the radio frequency signal in the first frequency band from passing through the individual terminal 111. That is, the radio frequency signal in the first frequency band that may pass through the individual terminal 111 can be attenuated. Accordingly, when the second frequency band is used, that is, when the radio frequency signal in the second frequency band is allowed to pass, it is possible to reduce the loss in the second frequency band and to increase the attenuation in the first frequency band. Therefore, in view of the effect achieved when the second frequency band is used as described above and the above-described effect achieved when the first frequency band is used, both when the first frequency band is used and when the second frequency band is used, it is possible to reduce the loss in the pass band while securing the isolation.

Furthermore, specifically, according to the multiplexer 1 according to the working example of the present embodiment, the impedance circuit Z1 is the capacitor C11 provided in series on the path r1. Here, an inductor has a worse Q value than a capacitor in many cases. Therefore, by the impedance circuit Z1 being the capacitor C11, it is possible to reduce the loss in the pass band when the first frequency band is used.

Furthermore, specifically, according to the multiplexer 1 according to the working example of the present embodiment, the impedance circuit Z2 is the capacitor C21 provided in series on the path r2. As described above, an inductor has a worse Q value than a capacitor in many cases. Therefore, by the impedance circuit Z2 being the capacitor C21, it is possible to reduce the loss in the pass band when the second frequency band is used.

Furthermore, specifically, according to the multiplexer 1 according to the working example of the present embodiment, the impedance circuit Z3 is the LC series resonance circuit in which the inductor L31 and the capacitor C31 are connected in series, and has the resonant frequency in which the impedance is minimized in or in the vicinity of the frequency band in which the first frequency band and the second frequency band overlap with each other. With this configuration, it is possible to further increase the attenuation of the second frequency band when the first frequency band is used, and it is possible to further increase the attenuation of the first frequency band when the second frequency band is used. Accordingly, both when the first frequency band is used and when the second frequency band is used, the isolation can be improved.

Furthermore, according to the multiplexer 1 according to the present embodiment, by including the impedance circuit Z4, the impedance of the demultiplexing circuit 11 at the common terminal 110c can be adjusted to a desired impedance. Accordingly, since the reflection loss due to the mismatching at the common terminal 110c can be suppressed, it is possible to further reduce the loss in the pass band.

Furthermore, specifically, according to the multiplexer 1 according to the working example of the present embodiment, the impedance circuit Z4 includes the capacitor C41 provided in series in the common connection portion of the path r1 and the path r2, and the inductor L41 connecting the node of the common connection portion and the ground. This makes it possible to widen the impedance adjustment range of the demultiplexing circuit 11 at the common terminal 110c. Accordingly, at the common terminal 110c, since the reflection loss due to the mismatching can be further suppressed by more accurately matching, it is possible to further reduce the loss in the pass band.

Furthermore, according to the multiplexer 1 according to the present embodiment, the switch circuit 12 includes the switch SW1 in which the one terminal is connected to the node N1 and the other terminal is connected to the ground with the impedance circuit Z3 interposed therebetween, and the switch SW2 in which the one terminal is connected to the node N2 and the other terminal is connected to the ground with the impedance circuit Z3 interposed therebetween. With this configuration, by the switches SW1 and SW2 sharing the impedance circuit Z3, the number thereof can be reduced, and the demultiplexing circuit 11 can thus be reduced in size. Accordingly, the multiplexer 1 can also be reduced in size as a whole.

It should be noted that the multiplexer according to the present embodiment is not limited to the above-described configuration. Therefore, as examples of various modifications, description will be made below using first to third modifications of the working example described above.

First Modification of First Embodiment

In the above-mentioned embodiment, the impedance circuit Z3 is provided in common to the paths r1 and r2. That is, the switch circuit 12 connects the nodes N1 and N2 to the ground with the same impedance circuit Z3 interposed therebetween. However, the impedance circuit Z3 may be provided individually in the paths r1 and r2.

Figure 11:
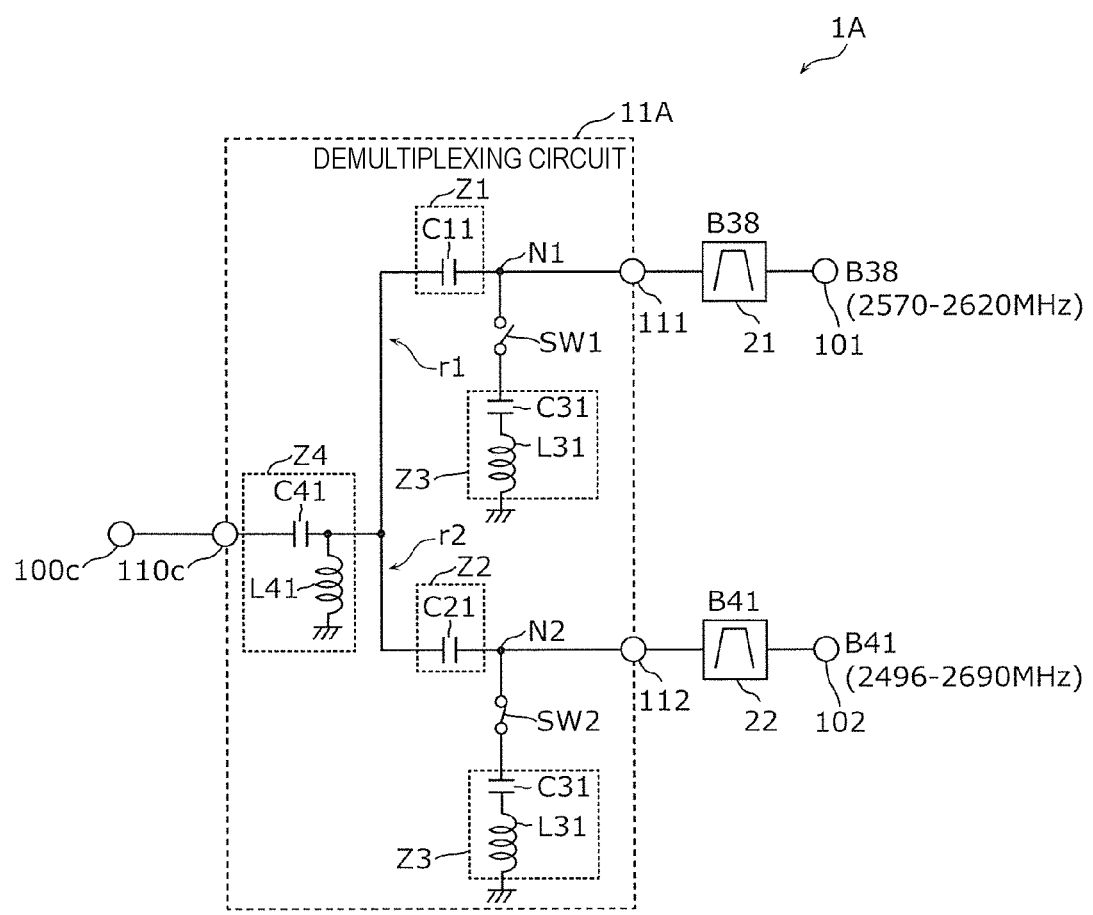
FIG. 11 is a diagram illustrating a configuration of a multiplexer according to a first modification of the first embodiment.

FIG. 11 is a diagram illustrating a configuration of a multiplexer 1A according to a first modification of the first embodiment.

A demultiplexing circuit 11A included in the multiplexer 1A illustrated in the diagram is different from the demultiplexing circuit 11 illustrated in FIG. 2 in a point that the impedance circuits Z3 are provided respectively in the paths r1 and r2.

That is, the demultiplexing circuit 11A includes a series circuit of the switch SW1 and one impedance circuit Z3, and a series circuit of the switch SW2 and another impedance circuit Z3. The series circuit of the switch SW1 and the one impedance circuit Z3 is provided on a path connecting the node N1 and the ground. The series circuit of the switch SW2 and the other one impedance circuit Z3 is provided on a path connecting the node N2 and the ground.

Even in the multiplexer 1A configured as described above, since the switches SW1 and SW2 connect only one of the nodes N1 and N2 to the ground with the impedance circuit Z3 interposed therebetween, the same effect as that of the multiplexer 1 described above can be achieved.

Note that in the configuration as described above, the connection order of the switch SW1 and the impedance circuit Z3 connected in series thereto is not particularly limited, and the switch SW1 may be provided on the node N1 side, or the impedance circuit Z3 may be provided on the node N1 side. Furthermore, the switch SW1 may be connected between the capacitor C31 and the inductor L31 which constitute the impedance circuit Z3. These matters also apply, in the same manner, to the connection order of the switch SW2 and the impedance circuit Z3 connected in series thereto.

Second Modification of First Embodiment

In the above-mentioned embodiment and the first modification thereof, the demultiplexing circuit has the impedance circuit Z4, but may not have it.

Figure 12:
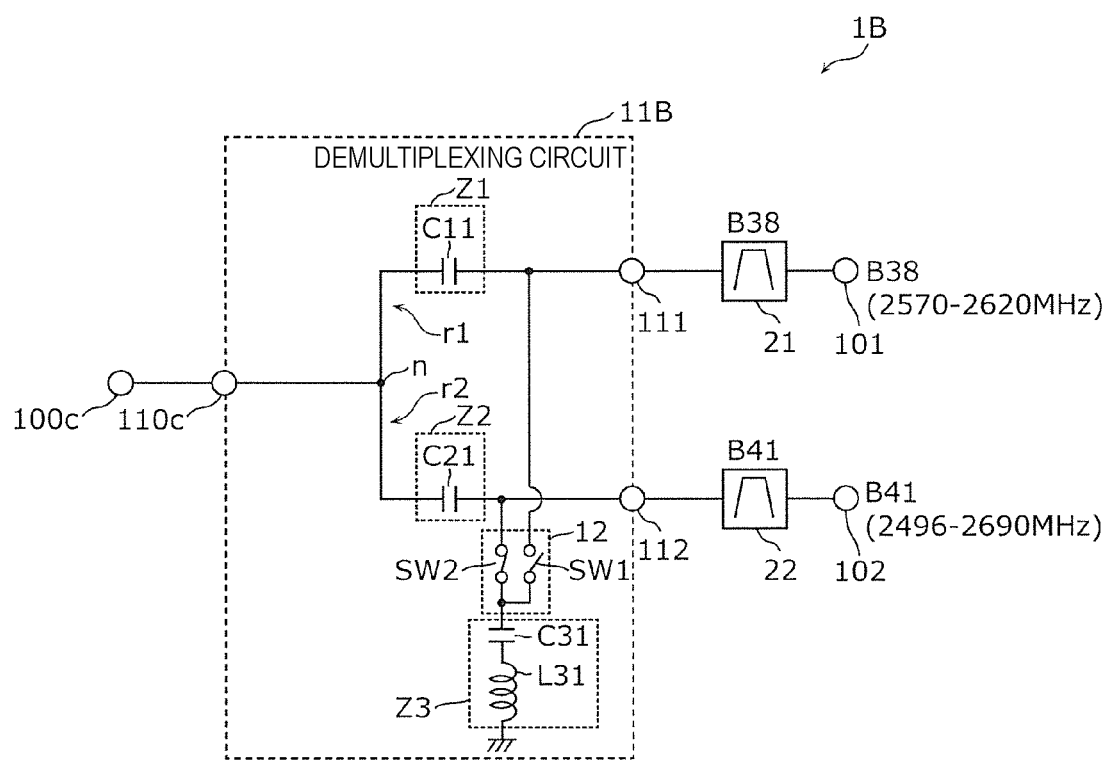
FIG. 12 is a diagram illustrating a configuration of a multiplexer according to a second modification of the first embodiment.

FIG. 12 is a diagram illustrating a configuration of a multiplexer 1B according to a second modification of the first embodiment.

A demultiplexing circuit 11B included in the multiplexer 1B illustrated in the diagram is different from the demultiplexing circuit 11 illustrated in FIG. 2 in a point that the impedance circuit Z4 is not provided.

Figure 13:
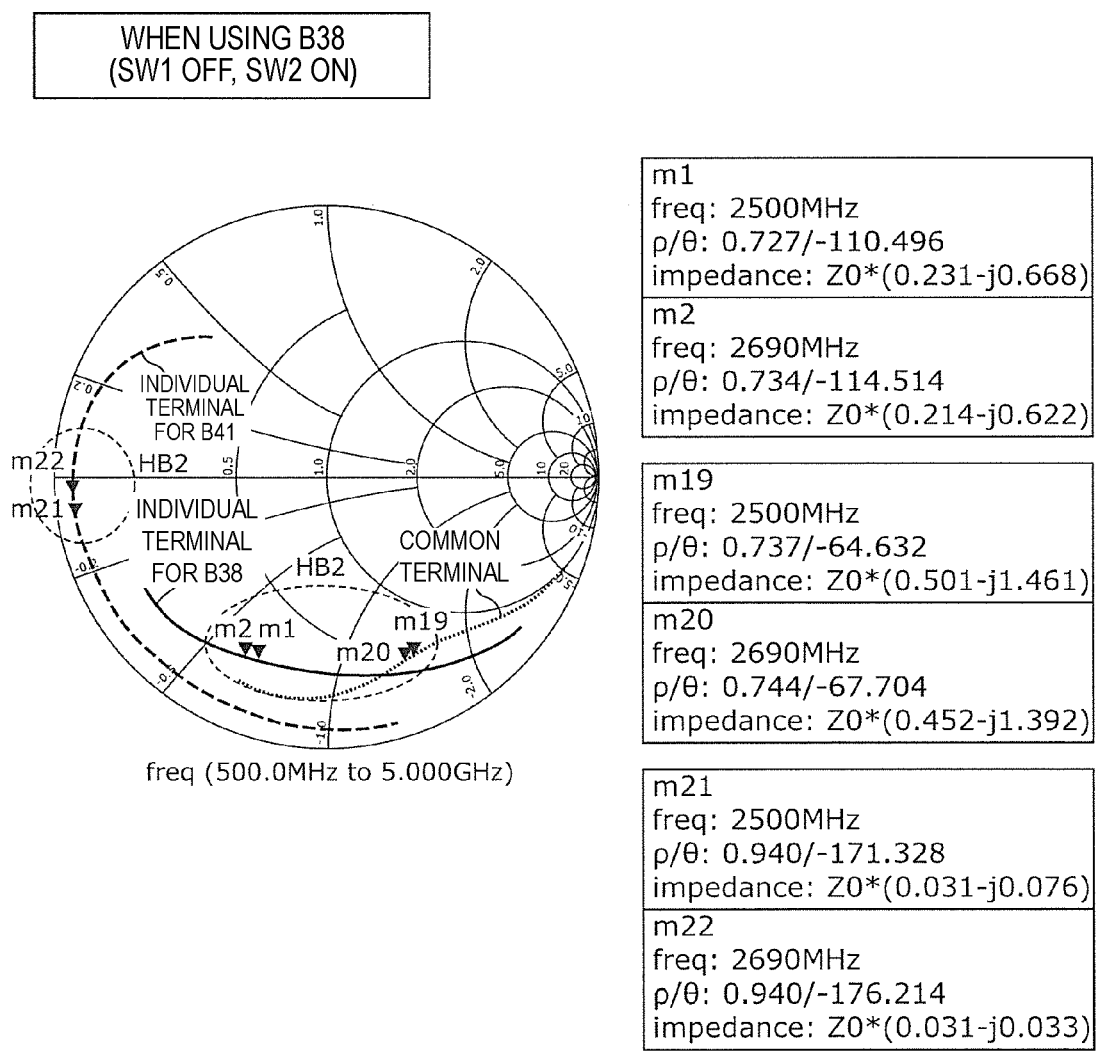
FIG. 13 is a Smith chart showing impedance characteristics of the demultiplexing circuit in a case where one switch is off and the other switch is on in the second modification of the first embodiment.
Figure 14:
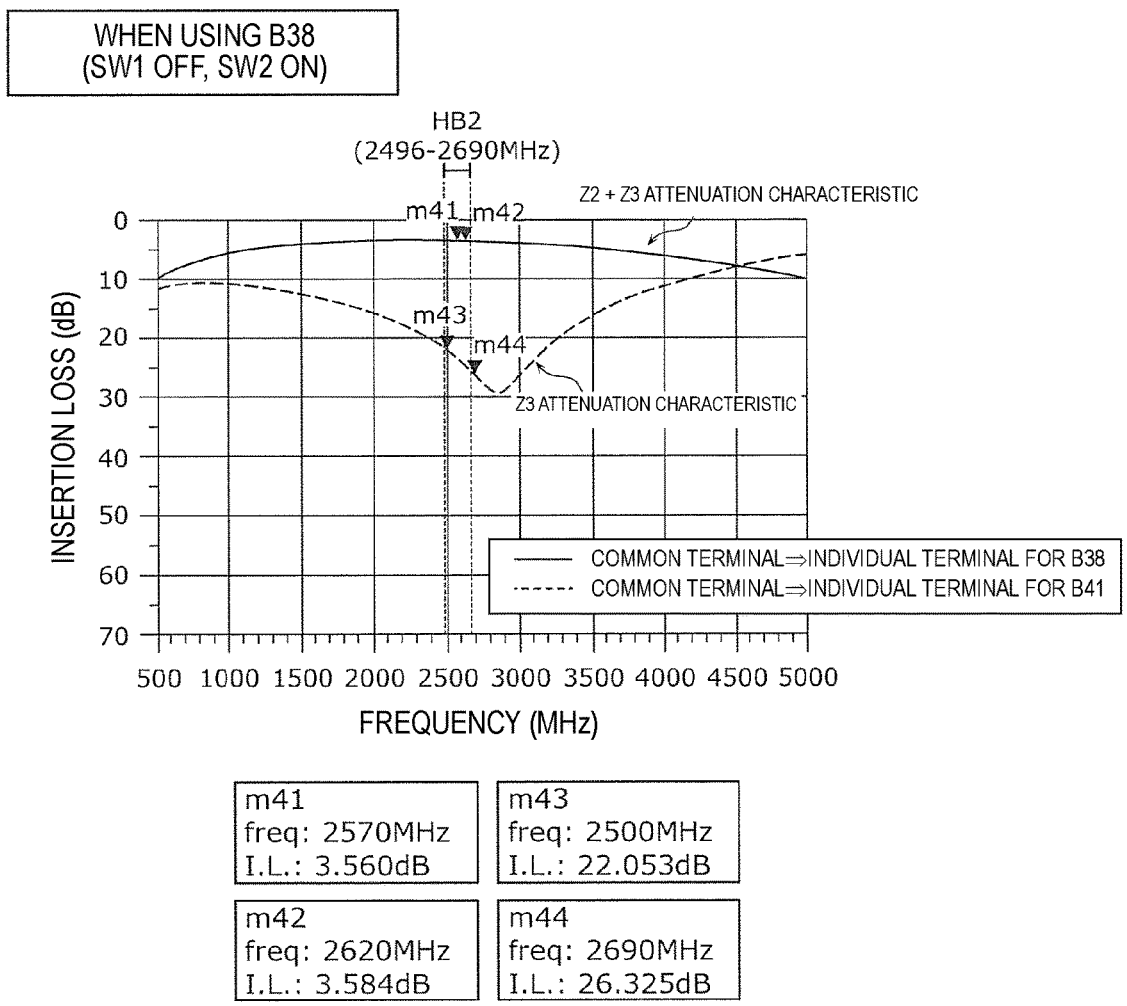
FIG. 14 is a graph showing bandpass characteristics of the demultiplexing circuit in the case where one switch is off and the other switch is on in the second modification of the first embodiment.

FIG. 13 is a Smith chart showing impedance characteristics of the demultiplexing circuit 11B in a case where the switch SW1 is off and the switch SW2 is on in the present modification. FIG. 14 is a graph showing bandpass characteristics of the demultiplexing circuit 11B in the case where the switch SW1 is off and the switch SW2 is on in the present modification.

As is apparent from FIG. 13, in this case, in the present modification, in comparison with the working example shown in FIG. 4, impedance of the common terminal 110c in the HB2 band and impedance of the individual terminal 111 for Band 38 in the HB2 band are shifted from 50Ω. That is, at the common terminal 110c and the individual terminal 111, mismatching in impedance occurs in the HB2 band.

Due to the influence of the mismatching, in the present modification shown in FIG. 14, the insertion loss between the common terminal 110c and the individual terminal 111 for Band 38 increases in the HB2 band in comparison with the working example shown in FIG. 5, and specifically, the following values are obtained.

Vicinity of HB2 band low band end: 3.560 dB
Vicinity of HB2 band high band end: 3.584 dB Furthermore, in the present modification, the impedance circuit Z4 is not provided. Accordingly, the radio frequency signal output to the individual terminal 111 for Band 38 is less likely to be attenuated on the lower band side than the HB2 band, by not being influenced by the attenuation characteristics by the synthesis circuit of the impedance circuits Z1 and Z4. In the same manner, the radio frequency signal output to the individual terminal 112 for Band 41 is less likely to be attenuated on the lower band side than the HB2 band, by not being influenced by the attenuation characteristics by the synthesis circuit of the impedance circuits Z2 and Z4.

Note that when the case where the switch SW1 is off and the switch SW2 is on and the case where the switch SW1 is on and the switch SW2 is off are compared, the difference is that the characteristics of the individual terminals 111 and 112 and a matter relating thereto are interchanged. Accordingly, description of characteristics in the case where the switch SW1 is on and the switch SW2 is off will be omitted.

Even in the multiplexer 1B configured as described above, by including the impedance circuits Z1 to Z3 and the switch circuit 12, the same effect as that of the multiplexer 1 described above can be achieved. That is, since the individual terminals 111 and 112 to which the radio frequency signal is output can be switched without necessarily providing a switch on the main path connecting the input terminal 100c and the individual terminals 111 and 112 to each other, the loss in the pass band can be reduced.

In this regard, in the present modification, in comparison with the working example, by not providing the impedance circuit Z4, the impedance of the demultiplexing circuit 11B at the common terminal 110c is shifted from 50Ω in the HB2 band. That is, when the normalized impedance on the common terminal 110c side of the demultiplexing circuit 11B is 50Ω, in the HB2 band, mismatching occurs at the common terminal 110c. Accordingly, in this case, in the present modification, although the loss due to the on-resistance of the switch provided on the main path can be suppressed in the same manner as in the working example, the loss becomes larger than that in the working example due to the influence of the loss (reflection loss) caused by the mismatching.

However, even in the configuration of the present modification, when the impedance of the demultiplexing circuit 11B at the common terminal 110c is matched with the circuit connected to the common terminal 110c in the HB2 band, the loss due to the mismatching can be suppressed. That is, when the normalized impedance of the demultiplexing circuit 11B on the common terminal 110c side shifts from 50Ω and the impedance of the demultiplexing circuit 11B at the common terminal 110c is substantially equal to the normalized impedance in the HB2 band, matching can be obtained at the common terminal 110c in the HB2 band. Accordingly, in this case, even in the present modification, it is possible to reduce the loss in the pass band to the same extent as that in the working example.

Third Modification of First Embodiment

Although the multiplexer supporting two bands has been described above, the above-mentioned configuration can also be applied to a multiplexer supporting three or more bands. Therefore, in the present modification, a multiplexer supporting three bands will be described.

Figure 15:
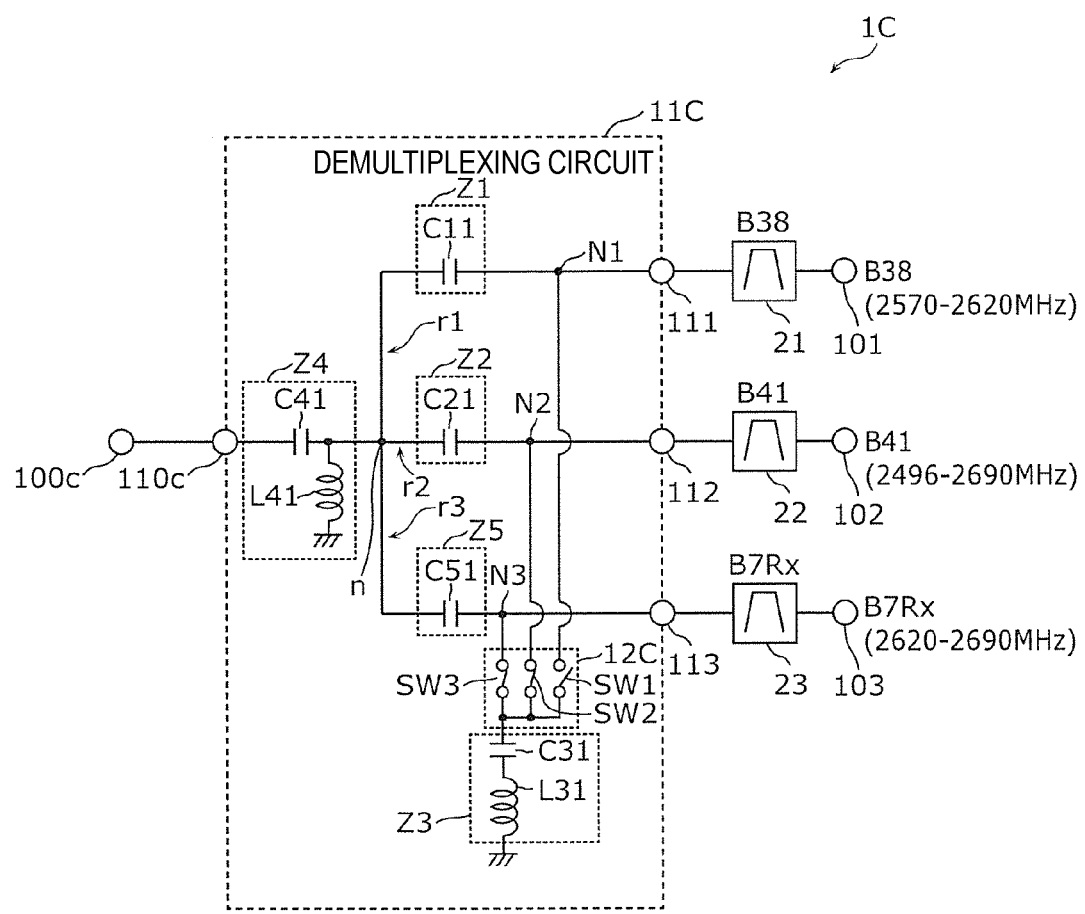
FIG. 15 is a diagram illustrating a configuration of a multiplexer according to a third modification of the first embodiment.

FIG. 15 is a diagram illustrating a configuration of a multiplexer 1C according to a third modification of the first embodiment.

The multiplexer 1C illustrated in the diagram further supports Band 7Rx (Band 7 reception band: 2620-2690 MHz) included in the HB2 band, as compared to the multiplexer 1 according to the working example.

Specifically, the multiplexer 1C further includes, in comparison with the multiplexer 1 according to the working example, a filter 23 configured to allow a radio frequency signal of Band 7Rx which is an example of a third frequency band which at least partially overlaps with Band 38 which is an example of the first frequency band and Band 41 which is an example of the second frequency band to pass therethrough. Here, the filter 23 is an example of a third filter. The radio frequency signal that has passed through the filter 23 is output from an output terminal 103 of the multiplexer 1C.

In addition, the multiplexer 1C includes, in comparison with the multiplexer 1 according to the working example, a demultiplexing circuit 11C having three individual terminals 111 to 113 instead of the demultiplexing circuit 11 having the two individual terminals 111 and 112.

Specifically, the demultiplexing circuit 11C further includes, in comparison with the demultiplexing circuit 11, the individual terminal 113 which is an example of a third individual terminal connected to the filter 23, and an impedance circuit Z5 which is a fifth impedance circuit provided in series on a path r3 which is a third path connecting the common terminal 110c and the individual terminal 113. Specifically, the impedance circuit Z5 is provided on the path r3 between the branch point n and the individual terminal 113. In the present modification, the impedance circuit Z5 is a capacitor C51 provided in series on the path r3. Note that the configuration of the impedance circuit Z5 is not limited to this.

Furthermore, the demultiplexing circuit 11C includes, in comparison with the demultiplexing circuit 11, a switch circuit 12C constituted of three SPST type switches SW1 to SW3 instead of the switch circuit 12 constituted of the two SPST type switches SW1 and SW2. The switch SW3 switches between conduction and non-conduction of the impedance circuit Z3 and a node N3. Here, the node N3 is a third node on the path r3 between the impedance circuit Z5 and the individual terminal 113. This switch circuit 12C connects the others excluding any one of the nodes N1 to N3 to the ground with the impedance circuit Z3 interposed therebetween. In other words, only one of the switches SW1 to SW3 becomes non-conductive (off) in accordance with the control signal, and the others become conductive (on).

Impedances of the common terminal 110c, and the individual terminals 111 to 113 of the demultiplexing circuit 11C configured as described above are adjusted by the impedance circuits Zl to Z5 so as to satisfy the following.

When the nodes N2 and N3 are connected to the ground with the impedance circuit Z3 interposed therebetween by the switch circuit 12C, the impedance of the demultiplexing circuit 11C at the individual terminal 111 is substantially equal to the normalized impedance such as 50Ω or the like in the HB2 band. That is, in this case, the impedance is substantially equal to the normalized impedance in Band 38 included in the HB2 band. Furthermore, in this case, the impedance of the demultiplexing circuit 11C at each of the individual terminals 112 and 113 is substantially equal to 0Ω or infinity in the HB2 band. That is, in this case, the impedance of the demultiplexing circuit 11C at the individual terminal 112 is substantially equal to 0Ω or infinity in Band 41 included in the HB2 band. In the same manner, the impedance of the demultiplexing circuit 11C at the individual terminal 113 is substantially equal to 0Ω or infinity in Band 7Rx included in the HB2 band.

On the other hand, when the nodes N1 and N3 are connected to the ground with the impedance circuit Z3 interposed therebetween by the switch circuit 12C, the impedance of the demultiplexing circuit 11C at the individual terminal 112 is substantially equal to the normalized impedance such as 50Ω or the like in the HB2 band. That is, in this case, the impedance is substantially equal to the normalized impedance in Band 41 included in the HB2 band. Furthermore, in this case, the impedance of the demultiplexing circuit 11C at each of the individual terminals 111 and 113 is substantially equal to 0Ω or infinity in the HB2 band. That is, in this case, the impedance of the demultiplexing circuit 11C at the individual terminal 111 is substantially equal to 0Ω or infinity in Band 38 included in the HB2 band. In the same manner, the impedance of the demultiplexing circuit 11C at the individual terminal 113 is substantially equal to 0Ω or infinity in Band 7Rx included in the HB2 band.

Furthermore, when the nodes N1 and N2 are connected to the ground with the impedance circuit Z3 interposed therebetween by the switch circuit 12C, the impedance of the demultiplexing circuit 11C at the individual terminal 111 is substantially equal to the normalized impedance such as 50Ω or the like in the HB2 band. That is, in this case, the impedance is substantially equal to the normalized impedance in Band 7Rx included in the HB2 band. Furthermore, in this case, the impedance of the demultiplexing circuit 11C at each of the individual terminals 111 and 112 is substantially equal to 0Ω or infinity in the HB2 band. That is, in this case, the impedance of the demultiplexing circuit 11C at the individual terminal 111 is substantially equal to 0Ω or infinity in Band 38 included in the HB2 band. In the same manner, the impedance of the demultiplexing circuit 11C at the individual terminal 112 is substantially equal to 0Ω or infinity in Band 41 included in the HB2 band.

The multiplexer 1C configured as described above can switch, in accordance with the control signal, among a first state in which the radio frequency signal of Band 38 is output from the output terminal 101, a second state in which the radio frequency signal of Band 41 is output from the output terminal 102, and a third state in which the radio frequency signal of Band 7Rx is output from the output terminal 103.

Figure 16:
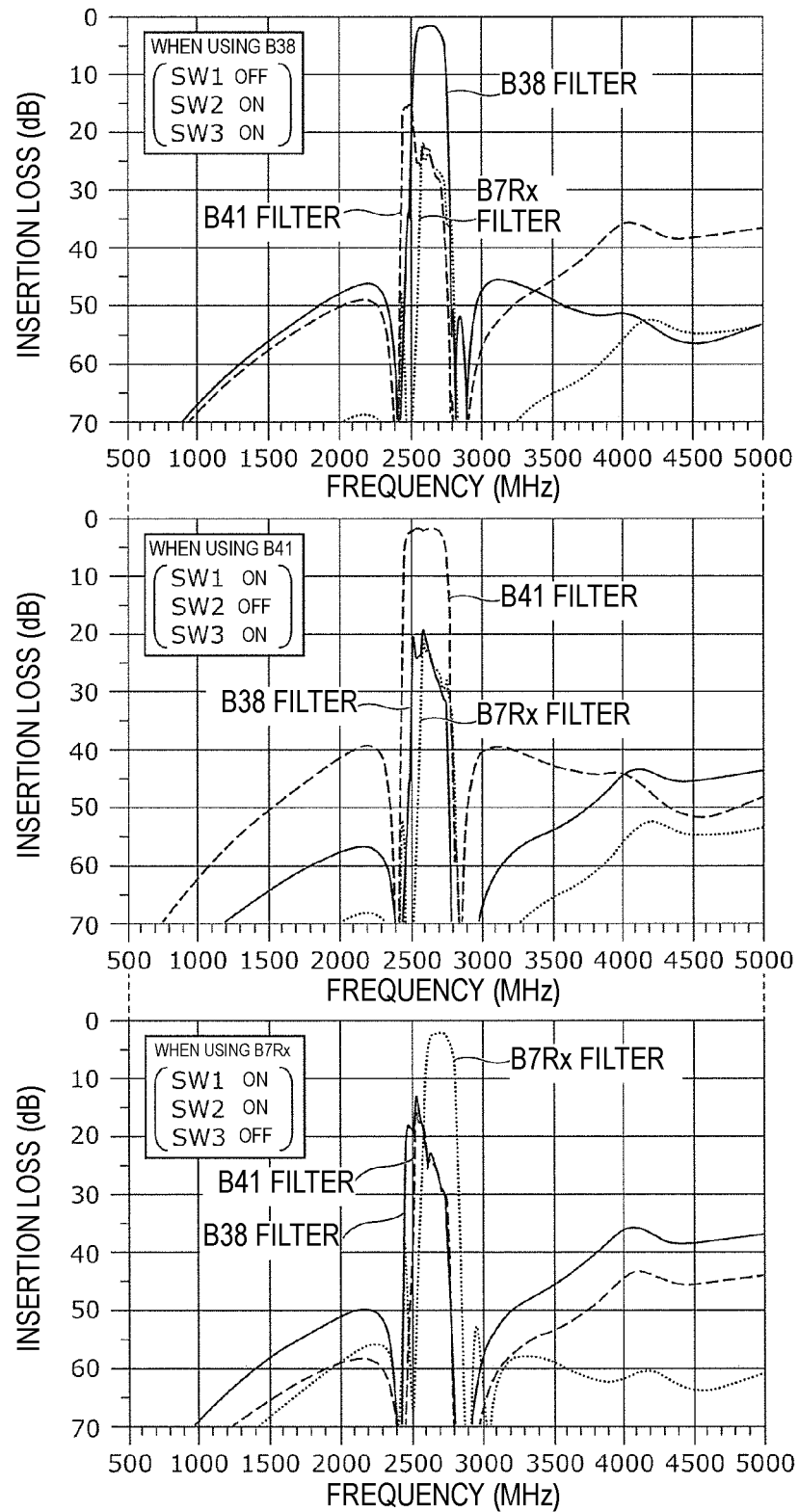
FIG. 16 includes graphs showing bandpass characteristics of the multiplexer according to the third modification of the first embodiment.

FIG. 16 includes graphs showing bandpass characteristics of the multiplexer 1C according to the third modification of the first embodiment. Specifically, in the upper part of the graphs, the bandpass characteristics in a case where the switch SW1 is off and the switches SW2 and SW3 are on are shown. In the middle part of the graphs, the bandpass characteristics in a case where the switches SW1 and SW3 are on and the switch SW2 is off are shown. In the lower part of the graphs, the bandpass characteristics in a case where the switches SW1 and SW2 are on and the switch SW3 is off are shown. Here, in the case where the switch SW1 is off and the switches SW2 and SW3 are on, the filter 21 for Band 38 is used. In the case where the switches SW1 and SW3 are on and the switch SW2 is off, the filter 22 for Band 41 is used. In the case where the switches SW1 and SW2 are on and the switch SW3 is off, the filter 23 for Band 7Rx is used.

As is apparent from the graphs, even in the multiplexer 1C supporting three bands, reduction in the loss is achieved in the pass band of the filter to be used. In other words, the loss in the frequency band of the band to be used is reduced. Furthermore, isolation between the band to be used and the other bands is secured.

As described above, according to the multiplexer 1C according to the present modification, included is the demultiplexing circuit 11C including the impedance circuits Z1, Z2, and Z5 provided in series on the respective paths r1 to r3, and the switch circuit 12C connecting the others excluding any one of the nodes N1 to N3 on the respective paths r1 to r3 to the ground with the impedance circuit Z3 interposed therebetween. With this configuration, by appropriately designing the impedance circuits Z1 to Z3 and Z5, in the multiplexer 1C supporting three bands, it is possible to reduce the loss in the pass band of the filter to be used and to secure the isolation between the band to be used and the other bands.

Second Embodiment

The multiplexer described in the first embodiment and the modifications thereof can be applied to a radio frequency front-end circuit and a communication device including the same. Therefore, in a second embodiment, such a radio frequency front-end circuit and a communication device will be described using a configuration including the multiplexer 1 according to the first embodiment as an example. Note that the radio frequency front-end circuit and the communication device according to the present embodiment may be configured so as to have any one of the modifications described above.

Figure 17:
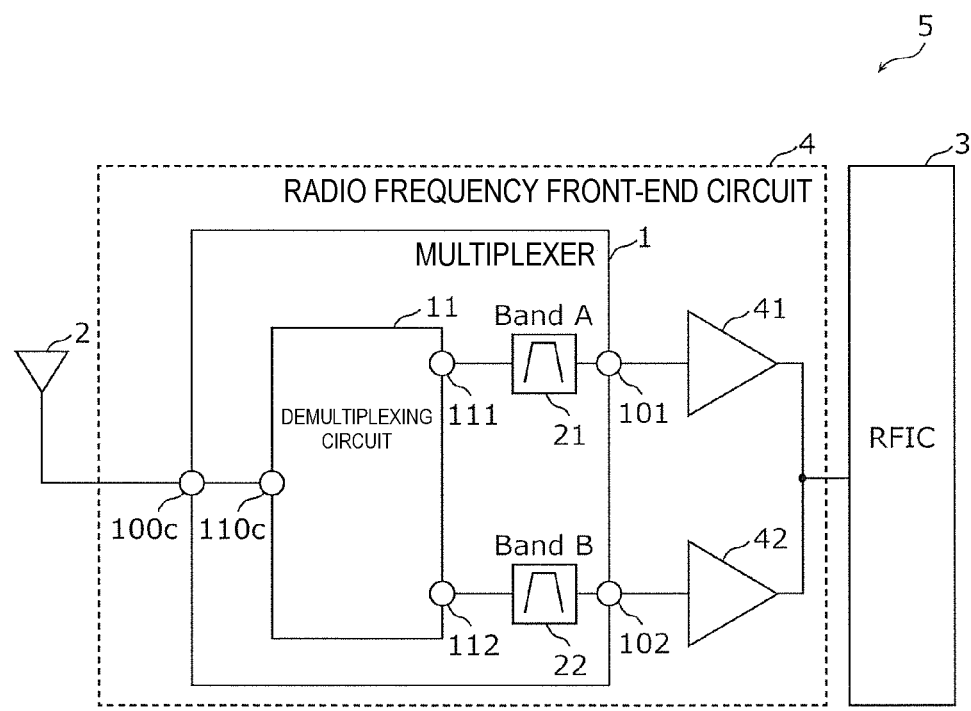
FIG. 17 is a block diagram illustrating a configuration of a communication device according to a second embodiment.

FIG. 17 is a block diagram illustrating a configuration of a communication device 5 according to the second embodiment.

The communication device 5 illustrated in the diagram supports Band A and Band B, and includes the antenna element 2, a radio frequency front-end circuit 4, and an RFIC 3. Note that the communication device 5 need not include the antenna element 2.

The radio frequency front-end circuit 4 is provided at a front end of the communication device 5, and transmits a radio frequency signal between the antenna element 2 and the RFIC 3. Specifically, the radio frequency front-end circuit 4 includes the multiplexer 1 described above and amplification circuits 41 and 42 connected to the multiplexer 1.

In the present embodiment, the amplification circuits 41 and 42 are low noise amplifiers supporting Band A and Band B, respectively, and each amplify the radio frequency signal output from the multiplexer 1 to output the resulting signal to the RFIC 3.

The RFIC 3 constitutes an RF signal processing circuit which performs signal processing on at least one of a radio frequency signal to be output to the radio frequency front-end circuit 4 and a radio frequency signal input from the radio frequency front-end circuit 4. In the present embodiment, the RFIC 3 performs signal processing on the radio frequency signal input from the radio frequency front-end circuit 4.

Furthermore, the RFIC 3 plays a function as a control unit that controls the switch circuit 12 (see FIG. 1) included in the multiplexer 1. Specifically, the RFIC 3 switches, by outputting the control signal corresponding to the band to be used to the switch circuit 12, the output terminals 101 and 102 to which the radio frequency signal is output in accordance with the switching of the band to be used.

Note that the control unit for controlling the switch circuit 12 is not limited to the RFIC 3, and may be, for example, a BBIC (Baseband Integrated Circuit), a control IC provided in the radio frequency front-end circuit 4, or the like.

According to the communication device 5 and the radio frequency front-end circuit 4 configured as described above, the communication quality is improved by providing the multiplexer 1 which has reduced loss in the frequency band of the band to be used.

Modification of Second Embodiment

Note that the configuration of the multiplexer described in the first embodiment and the modifications thereof can be applied to a radio frequency front-end circuit supporting CA in which a plurality of bands is simultaneously used and a communication device including the same. Therefore, in a modification of the second embodiment, such a radio frequency front-end circuit and a communication device will be described using a configuration including the multiplexer 1 according to the working example of the first embodiment as an example. Note that the radio frequency front-end circuit and the communication device according to the present modification may be configured so as to have any one of the modifications described above.

Figure 18:
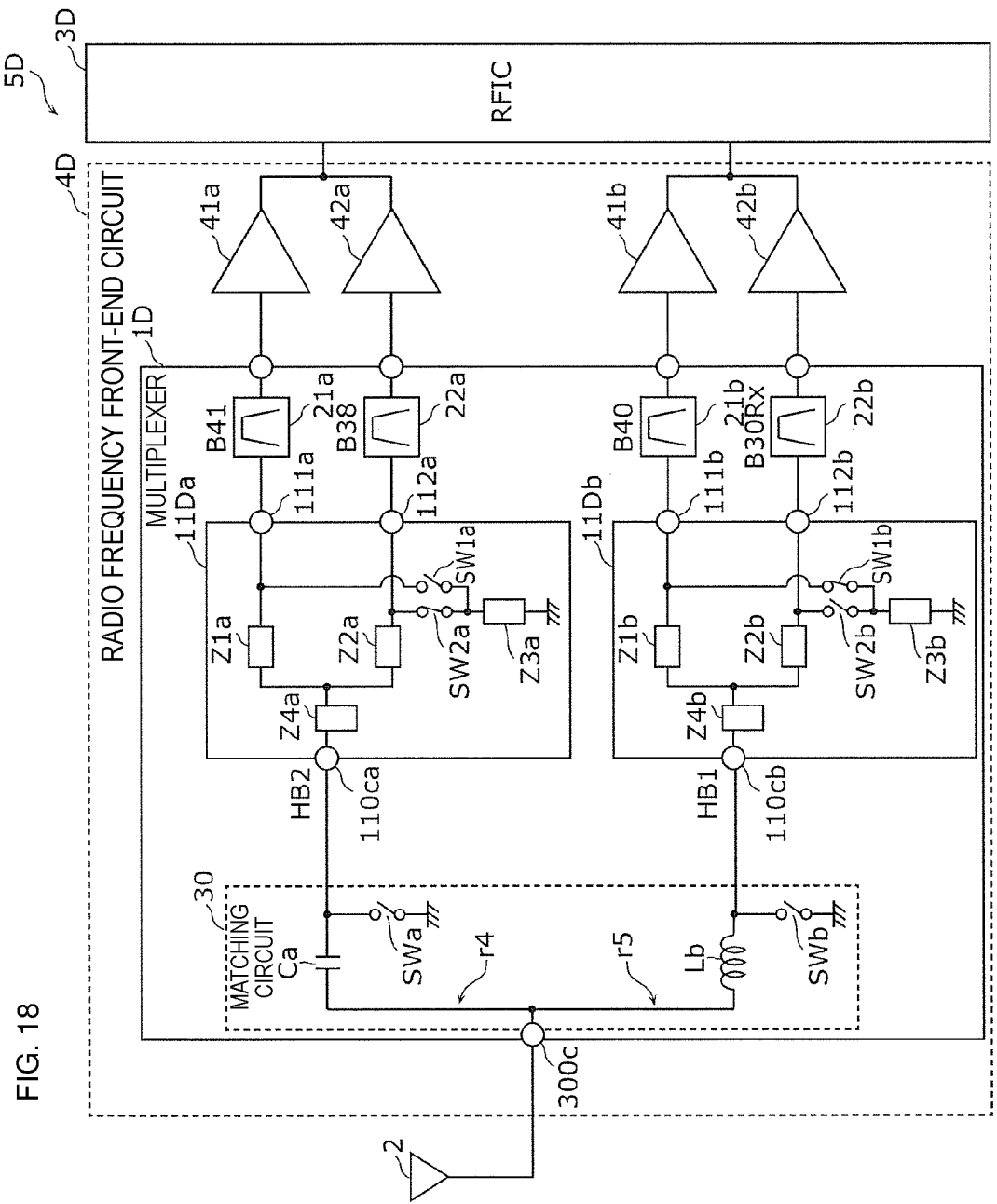
FIG. 18 is a diagram illustrating a configuration of a communication device according to a modification of the second embodiment.

FIG. 18 is a diagram illustrating a configuration of a communication device 5D according to the modification of the second embodiment.

The communication device 5D illustrated in the diagram supports Band 40 (2300-2400 MHz) and Band 30Rx (Band 30 receive band: 2350-2360 MHz) included in an HB1 band (2300-2400 MHz), and Band 41 (2496-2690 MHz) and Band 38 (2570-2620 MHz) included in the HB2 band (2496-2690 MHz), and includes the antenna element 2, a radio frequency front-end circuit 4D, and an RFIC 3D. Note that the communication device 5D need not include the antenna element 2.

The radio frequency front-end circuit 4D and the RFIC 3D are mainly different from the radio frequency front-end circuit 4 and the RFIC 3 of the second embodiment in a point of supporting the CA and in a matter relating thereto. For this reason, hereinafter, for the radio frequency front-end circuit 4D and the RFIC 3D, respectively, different points from the radio frequency front-end circuit 4 and the RFIC 3 will be mainly described, and other points will be described in a simplified manner.

The radio frequency front-end circuit 4D includes a multiplexer 1D and amplification circuits 41a, 42a, 41b, and 42b connected to the multiplexer 1D. The amplification circuits 41a, 42a, 41b, and 42b are low noise amplifiers corresponding to Band 41, Band 38, Band 40, and Band 30Rx, respectively, and each amplify the radio frequency signal output from the multiplexer 1D to output the resulting signal to the RFIC 3D.

Hereinafter, the multiplexer 1D will be described in detail.

The multiplexer 1D includes demultiplexing circuits 11Da and 11Db, filters 21a, 22a, 21b, and 22b, and a matching circuit 30.

Each of the demultiplexing circuits 11Da and 11Db corresponds to the demultiplexing circuit 11 in the working example described above.

Specifically, the demultiplexing circuit 11Da is a demultiplexing circuit for HB2 having a common terminal 110ca corresponding to the common terminal 110c and individual terminals 111a and 112a respectively corresponding to the individual terminals 111 and 112. Furthermore, the demultiplexing circuit 11Da further includes impedance circuits Z1a to Z4a respectively corresponding to the impedance circuits Z1 to Z4, and switches SW1a and SW2a respectively corresponding to the switches SW1 and SW2.

The demultiplexing circuit 11Db is a demultiplexing circuit for HB1 having a common terminal 110cb corresponding to the common terminal 110c and individual terminals 111b and 112b respectively corresponding to the individual terminals 111 and 112. Furthermore, the demultiplexing circuit 11Db further includes impedance circuits Z1b to Z4b respectively corresponding to the impedance circuits Z1 to Z4, and switches SW1b and SW2b respectively corresponding to the switches SW1 and SW2.

Note that each of the demultiplexing circuits 11Da and 11Db has impedance characteristics different from those of the demultiplexing circuit 11 in the working example described above. This will be described using the demultiplexing circuit 11Da. The same as in the demultiplexing circuit 11Da is applied to the demultiplexing circuit 11Db, and thus detailed description thereof will be omitted.

Furthermore, the impedance characteristics of the demultiplexing circuit 11Da and the impedance characteristics of the demultiplexing circuit 11Db are not limited to the same, and may be different from each other. Furthermore, at least one of the demultiplexing circuits 11Da and 11Db may have the same impedance characteristics as those of the demultiplexing circuit 11 according to the working example.

Figure 19:
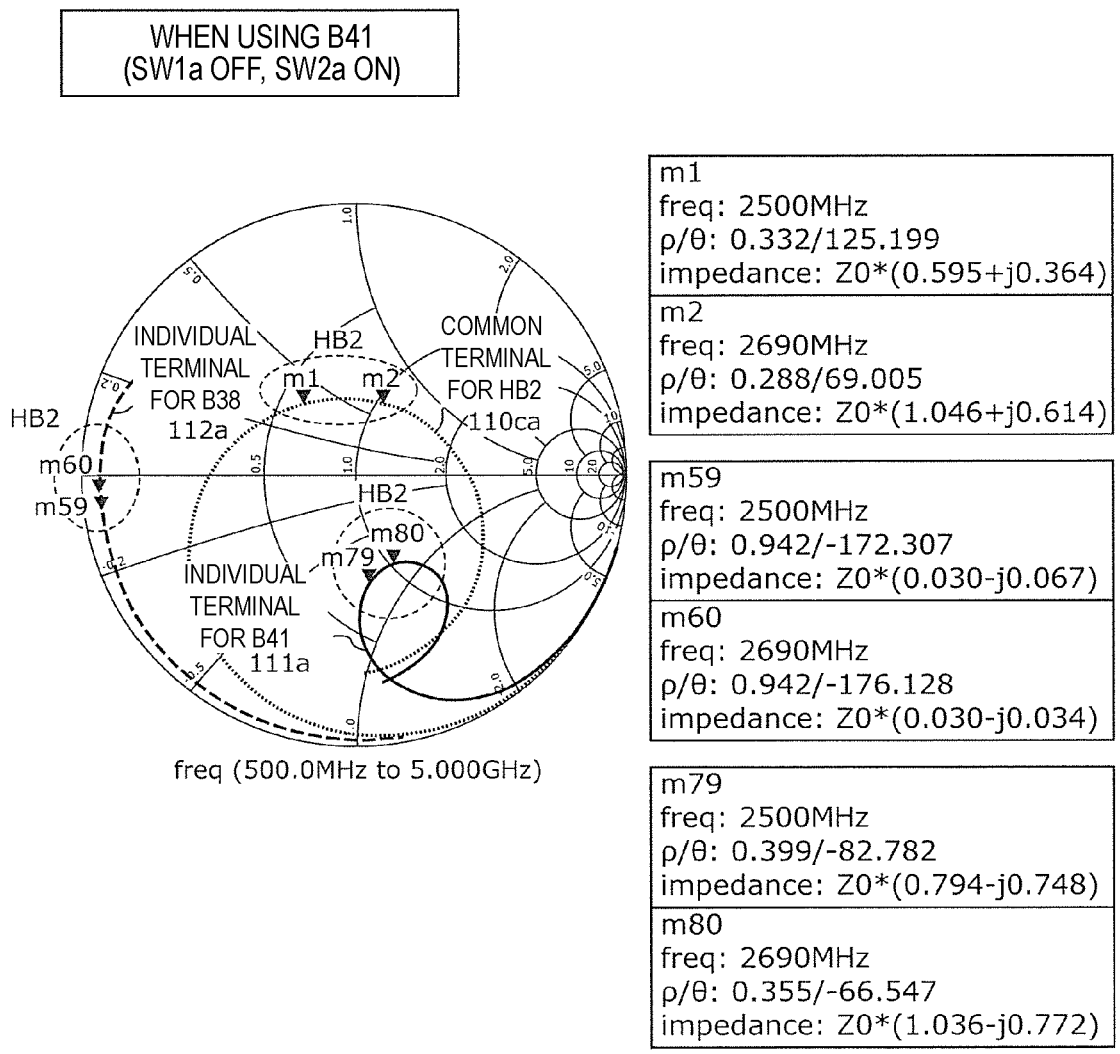
FIG. 19 is a Smith chart showing impedance characteristics of a demultiplexing circuit for HB2 in a case of a certain condition in the modification of the second embodiment.

FIG. 19 is a Smith chart showing impedance characteristics of the demultiplexing circuit 11Da for HB2 in a case of a certain condition in the present modification. Specifically, the diagram shows the impedance characteristics in a case where the switch SW1a is off and the switch SW2a is on, that is, in a case where Band 41 is used.

As illustrated in the diagram, in this case, the impedance of the common terminal 110ca, which is indicated by the "common terminal for HB2", in the HB2 band in the diagram and the impedance of the individual terminal 111a for Band 41, which is indicated by the "individual terminal for B41", in the HB2 band in the diagram are both shifted from 50Ω. These impedances are substantially equal to the normalized impedance of the common terminal 110c in the present modification and the normalized impedance of the individual terminal 111a in the present modification, respectively. On the other hand, impedance of the individual terminal 112a for Band 38, which is indicated by the "individual terminal for B38", in the HB2 band in the diagram is close to 0Ω.

With this, in this case, the radio frequency signal in the HB2 band input to the common terminal 110ca is output from the individual terminal 111a for Band 41 with low loss, and is hardly output from the individual terminal 112a for Band 38. That is, in this case, the demultiplexing circuit 11Da according to the present modification exerts the same bandpass characteristics as those of the demultiplexing circuit 11 according to the working example.

Note that detailed description is omitted in the case where the switch SW1a is on and the switch SW2a is off, that is, in the case where Band 38 is used, but in this case, the radio frequency signal in the HB2 band input to the common terminal 110ca is output from the individual terminal 112a for Band 38 with low loss, and is hardly output from the individual terminal 111a for Band 41. That is, in this case as well, the demultiplexing circuit 11Da according to the present modification exerts the same bandpass characteristics as those of the demultiplexing circuit 11 according to the working example.

The filter 21a is an example of the first filter in the present modification, is connected to the individual terminal 111a, and allows a radio frequency signal of Band 41 which is an example of the first frequency band in the present modification to pass therethrough. The filter 22a is an example of the second filter in the present modification, is connected to the individual terminal 112a, and allows a radio frequency signal of Band 38 which is an example of the second frequency band in the present modification to pass therethrough. The filter 21b is another example of the first filter in the present modification, is connected to the individual terminal 111b, and allows a radio frequency signal of Band 40 which is another example of the first frequency band in the present modification to pass therethrough. The filter 22b is another example of the second filter in the present modification, is connected to the individual terminal 112b, and allows a radio frequency signal of Band 30Rx which is another example of the second frequency band in the present modification to pass therethrough.

As described above, the multiplexer 1D includes a plurality of sets constituted of the demultiplexing circuit, the first filter, and the second filter. Specifically, the multiplexer 1D includes a first set constituted of the demultiplexing circuit 11Da and the filters 21a and 22a, and a second set constituted of the demultiplexing circuit 11Db and the filters 21b and 22b. Note that the number of sets constituted of the demultiplexing circuit, the first filter, and the second filter is not limited to two, and three or more sets may be provided.

Here, the HB2 band including Band 41 which is the first frequency band and Band 38 which is the second frequency band in the first set is higher in frequency than the HB1 band including Band 40 which is the first frequency band and Band 30Rx which is the second frequency band in the second set.

The matching circuit 30 includes a common terminal 300c, a capacitor Ca and a switch SWa, and an inductor Lb and a switch SWb.

The common terminal 300c is a second common terminal to which the common terminal 110ca which is the first common terminal included in the first set and the common terminal 110cb which is the first common terminal included in the second set are connected in common. In the present modification, the common terminal 300c is an input terminal of the multiplexer 1D connected to the antenna element 2.

The capacitor Ca is a fifth capacitor provided in series on a path r4 which is a fourth path connecting the common terminal 300c and the common terminal 110ca. The switch SWa is a third switch element connected between a node on the path r4 between the capacitor Ca and the common terminal 110ca and the ground.

The inductor Lb is a third inductor provided in series on a path r5 which is a fifth path connecting the common terminal 300c and the common terminal 110cb. The switch SWb is a fourth switch element connected between a node on the path r5 between the inductor Lb and the common terminal 110cb and the ground.

Here, on and off of the switches SWa and SWb are switched as described below in accordance with a control signal from the control unit.

Specifically, when the multiplexer 1D transmits only the radio frequency signal of the HB2 band, that is, at the time of a Non-CA operation with Band 41 or 38, the switch SWa is turned off and the switch SWb is turned on. On the other hand, when the multiplexer 1D transmits only the radio frequency signal of the HB1 band, that is, at the time of a Non-CA operation with Band 40 or 30Rx, the switch SWa is turned on and the switch SWb is turned off. In contrast, when the multiplexer 1D simultaneously transmits the radio frequency signals of the HB2 band and the HB1 band, that is, at the time of a CA operation with any one of Bands 41 and 38 and any one of Bands 40 and 30Rx, the switch SWa is turned off and the switch SWb is turned off.

In the multiplexer 1D configured as described above, the impedance when the path r4 is viewed from the common terminal 300c is set, when the switch SWa is off, so as to be located in a third quadrant in a lower left part relative to the center on the Smith chart in the HB2 band, and to indicate to be capacitive in the HB1 band. On the other hand, the impedance when the path r5 is viewed from the common terminal 300c is set, when the switch SWb is off, so as to be located in a second quadrant in an upper left part relative to the center on the Smith chart in the HB1 band, and to indicate to be inductive in the HB2 band.

This impedance setting is achieved by appropriately adjusting the impedance of the demultiplexing circuit 11Da at the common terminal 110ca, the impedance of the demultiplexing circuit 11Db at the common terminal 110cb, and the element values of the capacitor Ca and the inductor Lb that constitute the matching circuit 30. Therefore, each of the impedance of the demultiplexing circuit 11Da at the common terminal 110ca and the impedance of the demultiplexing circuit 11Db at the common terminal 110cb is not limited to 50Ω, and is appropriately adjusted to the impedance that satisfies the above-mentioned impedance by the impedance circuits Z4a and Z4b.

Here, in a specific frequency band, the expression that the impedance is located in a specific quadrant includes not only that the whole of the specific frequency band is located in the specific quadrant, but also that substantially the whole of the specific frequency band (for example, equal to or more than 50%, specifically equal to or more than 80%) is located in the specific quadrant.

The multiplexer 1D configured in this manner can obtain matching in the pass band both at the time of the CA operation and at the time of the non-CA operation.

Table 1 shows the states (on or off) of the switches SW1a, SW2a, SW1b, SW2b, SWa, and SWb at this time. In the table, "●" indicates that the corresponding switch is off, and "-" indicates that the corresponding switch is on.

TABLE 1

| | Demultiplexing Circuit 11Da for HB2 | | Demultiplexing Circuit 11Db for HB1 | | Matching Circuit 30 | |
|---|---|---|---|---|---|---|
| | SW1a | SW2a | SW1b | SW2b | SWa | SWb |
| 2CA (B40/B41) | ● | — | ● | — | ● | ● |
| 2CA (B30Rx/B38) | — | ● | — | ● | ● | ● |
| Non-CA (B30Rx) | — | — | — | ● | — | ● |
| Non-CA (B40) | — | — | ● | — | — | ● |
| Non-CA (B38) | — | ● | — | — | ● | — |
| Non-CA (B41) | ● | — | — | — | ● | — |

Figure 20:
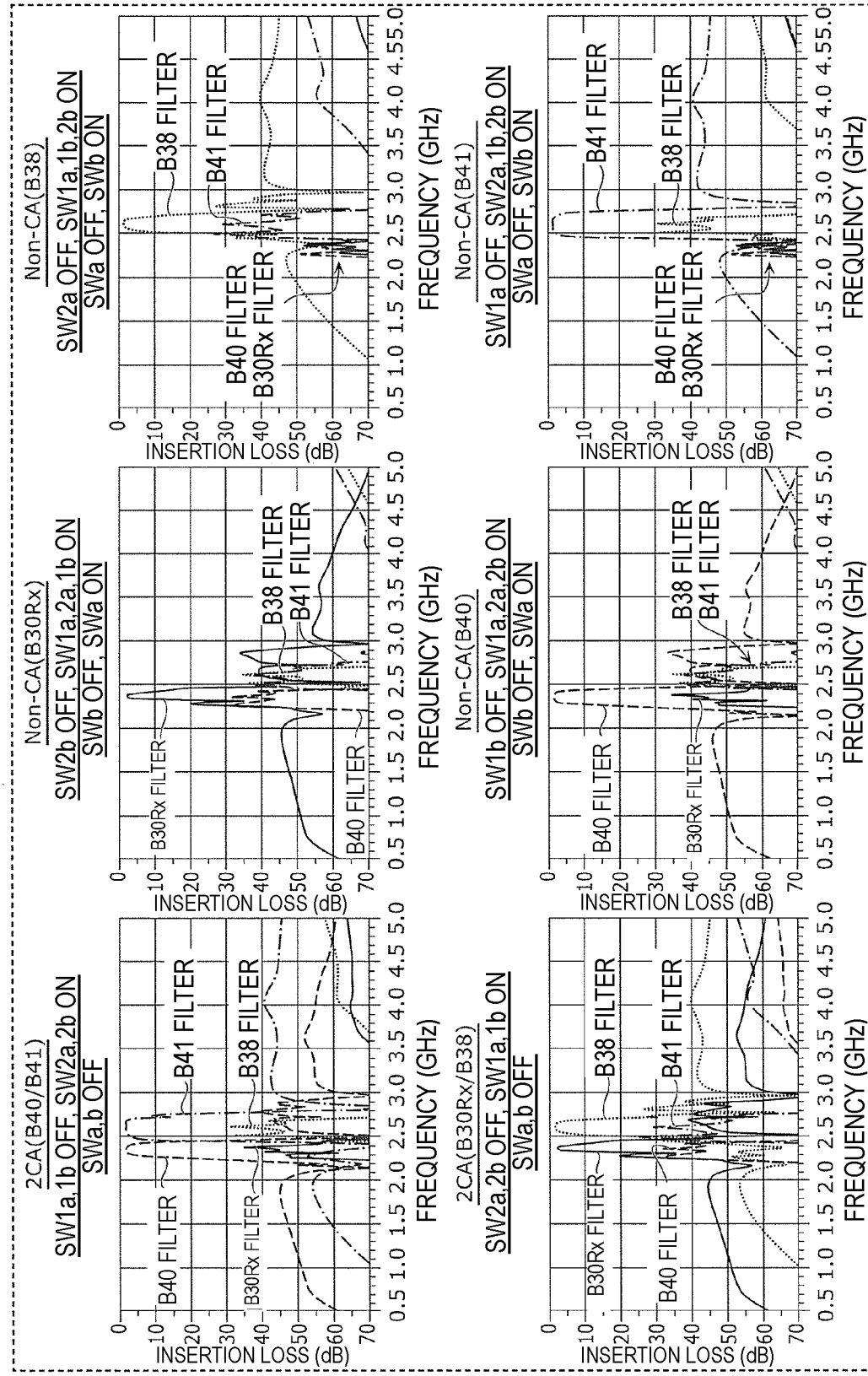
FIG. 20 includes graphs showing bandpass characteristics of a multiplexer according to the modification of the second embodiment.

FIG. 20 includes graphs showing bandpass characteristics of the multiplexer 1D according to the present modification. Specifically, in the upper part of the left column of the graphs, the bandpass characteristics during the CA operation with Band 40 and Band 41 (2CA (B40/B41)) are shown. In the lower part of the left column of the graphs, the bandpass characteristics during the CA operation with Band 30Rx and Band 38 (2CA (B30Rx/B38)) are shown. In the upper part of the center column of the graphs, the bandpass characteristics during the non-CA operation with Band 30Rx (Non-CA (B30Rx)) are shown. In the lower part of the center column of the graphs, the bandpass characteristics during the non-CA operation with Band 40 (Non-CA (B40)) are shown. In the upper part of the right column of the graphs, the bandpass characteristics during the non-CA operation with Band 38 (Non-CA (B38)) are shown. In the lower part of the right column of the graphs, the bandpass characteristics during the non-CA operation with Band 41 (Non-CA (B41)) are shown.

As is apparent from the graphs, in the multiplexer 1D, the loss is reduced in the pass band both during the CA operation and during the non-CA operation.

That is, the multiplexer 1D includes a plurality of sets constituted of the demultiplexing circuit (demultiplexing circuits 11Da and 11Db), the first filter (filters 21a and 21b), and the second filter (filters 22a and 22b), and further includes the matching circuit 30. With this configuration, by appropriately adjusting the impedance viewed from the common terminal 300c when the switch SWa is off and the impedance viewed from the common terminal 300c when the switch SWb is off, the following effects can be obtained. That is, both during the CA operation with the band included in the HB2 band and the band included in the HB1 band, and during the non-CA operation with the band included in the HB2 band or the band included in the HB1 band, the loss in the pass band is reduced.

Therefore, according to the radio frequency front-end circuit 4D and the communication device 5D according to the present modification, by including the multiplexer 1D, the communication quality is improved both during the CA operation and during the non-CA operation.

Note that one of the filters 21a and 22a may not be provided, and in this case, the matching circuit 30 and the other of the filters 21a and 22a may be connected to each other without necessarily the demultiplexing circuit 11Da interposed therebetween. Furthermore, one of the filters 21b and 22b may not be provided, and in this case, the matching circuit 30 and the other of the filters 21b and 22b may be connected to each other without necessarily the demultiplexing circuit 11Db interposed therebetween.

Other Embodiments

Although the multiplexer, and the radio frequency front-end circuit and the communication device including the same according to the embodiments of the present disclosure have been described above, the present disclosure is not limited to the individual embodiments and the working examples and modifications thereof. Variations on these embodiments and working examples and modifications thereof conceived of by those skilled in the art, and embodiments created by combining constituent elements from different embodiments and working examples and modifications thereof may be included in the scope of one or more aspects of the present disclosure as long as they do not depart from the spirit of the present disclosure.

For example, the second frequency band at least partially overlaps with the first frequency band, but the expression "at least partially overlap" also includes a case where the band end of the first frequency band and the band end of the second frequency band slightly overlap with each other, and also includes a case where the band end of the first frequency band and the band end of the second frequency band are in contact with each other. Specifically, when the first frequency band is 3.3-3.6 GHz and the second frequency band is 3.6-4.2 GHz, the band ends of the first frequency band and the second frequency band are in contact with each other, that is, the frequency bands at least partially overlap with each other.

For example, each of the impedance circuits Z1 to Z3 is not limited to the above-mentioned configuration, and may be constituted of, for example, any one of a capacitor alone, an inductor alone, a parallel circuit of a capacitor and an inductor, and a series circuit of a capacitor and an inductor. This also applies, in the same manner, to the impedance circuit Z5.

Furthermore, the impedance circuit Z4 may also constituted of an inductor provided in series on the path which is the common connection portion between the path r1 and the path r2, and a capacitor connected between the path and the ground. Furthermore, the impedance circuit Z4 is not limited to being constituted of a plurality of circuit elements, and may be constituted of one circuit element.

Here, an inductor has a worse Q value than a capacitor in many cases. Therefore, by the impedance circuit Z4 being the capacitor C41, both when Band 38 is used and when Band 41 is used, it is possible to reduce the loss in the pass band.

Furthermore, when the impedance of the common terminal 110c indicates to be capacitive when the impedance circuit Z4 is not provided, by providing the impedance circuit Z4 which is the inductor L41, the impedance of the common terminal 110c can be made close to 50Ω. Accordingly, when the normalized impedance of the common terminal 110c at the pass band is 50Ω, since the reflection loss due to the mismatching can be suppressed, it is possible to reduce the loss in the pass band. This is particularly useful when an acoustic wave filter or the like is used in which the impedance indicates to be capacitive in many cases as the filters 21 and 22.

Furthermore, for example, in the multiplexer, an inductor or a capacitor may further be connected, or a circuit element, such as a resistance element or the like, other than the inductor and the capacitor may be connected.

INDUSTRIAL APPLICABILITY

The present disclosure can be widely applicable to a communication apparatus such as a mobile phone or the like, as a multiplexer with low loss used for a radio frequency front-end circuit and a communication device supporting a plurality of frequency bands.

REFERENCE SIGNS LIST 1, 1A, 1B, 1C, 1D, 9 MULTIPLEXER
2 ANTENNA ELEMENT
3, 3D RFIC
4, 4D RADIO FREQUENCY FRONT-END CIRCUIT
5, 5D COMMUNICATION DEVICE
11, 11A, 11B, 11C, 11Da, 11Db, 91 DEMULTIPLEXING CIRCUIT
12, 12C SWITCH CIRCUIT
21, 21a, 21b, 22, 22a, 22b, 23 FILTER
41, 41a, 41b, 42, 42a, 42b AMPLIFICATION CIRCUIT
100c INPUT TERMINAL
101, 102, 103 OUTPUT TERMINAL
110c, 110ca, 110cb, 300c COMMON TERMINAL
111, 111a, 111b, 112, 112a, 112b, 113 INDIVIDUAL TERMINAL
C11, C21, C31, C41, C51 CAPACITOR
L31, L41 INDUCTOR
n BRANCH POINT
N1 TO N3 NODE
r1 TO r5 PATH
SW1, SW1a, SW1b, SW2, SW2a, SW2b, SW3, SW9, SWa, SWb SWITCH
Z1, Z1a, Z1b, Z2, Z2a, Z2b, Z3, Z2b, Z3b, Z4, Z4a, Z4b IMPEDANCE CIRCUIT

The invention claimed is:

1. A multiplexer comprising:
a demultiplexing circuit comprising a first common terminal, a first individual terminal, and a second individual terminal;
a first filter connected to the first individual terminal and configured to pass a first radio frequency signal in a first frequency band; and
a second filter connected to the second individual terminal and configured to pass a second radio frequency signal in a second frequency band, the second frequency band at least partially overlapping the first frequency band, wherein the demultiplexing circuit further comprises:
a first impedance circuit in a first path, the first path connecting the first common terminal and the first individual terminal,
a second impedance circuit in a second path, the second path connecting the first common terminal and the second individual terminal,
a third impedance circuit, and
a switch circuit, and
the switch circuit is configured to selectively connect the third impedance circuit between ground and either a first node on the first path or a second node on the second path, the first node being between the first impedance circuit and the first individual terminal, and the second node being between the second impedance circuit and the second individual terminal.

2. The multiplexer according to claim 1, wherein the switch circuit is connected between the third impedance circuit and the first and second nodes.

3. The multiplexer according to claim 1,
wherein the first path and the second path are the same between the first common terminal and a branch node,
the first impedance circuit is in the first path between the branch node and the first individual terminal, and
the second impedance circuit is in the second path between the branch node and the second individual terminal.

4. The multiplexer according to claim 1, wherein when the second node is connected to ground via the third impedance circuit:
an impedance of the demultiplexing circuit at the first individual terminal is substantially equal to a normalized impedance in the first frequency band, and
an impedance of the demultiplexing circuit at the second individual terminal is substantially equal to zero Ohms or infinity in the second frequency band.

5. The multiplexer according to claim 4, wherein when the first node is connected to ground via the third impedance circuit:
the impedance of the demultiplexing circuit at the second individual terminal is substantially equal to a normalized impedance in the second frequency band, and
the impedance of the demultiplexing circuit at the first individual terminal is substantially equal to zero Ohms or infinity in the first frequency band.

6. The multiplexer according to claim 1, wherein the first impedance circuit comprises a first capacitor in the first path.

7. The multiplexer according to claim 1, wherein the second impedance circuit comprise a second capacitor in the second path.

8. The multiplexer according to claim 1, wherein:
the third impedance circuit is an LC series resonance circuit comprising a first inductor and a third capacitor connected in series, and
the third impedance circuit has a resonant frequency in which impedance is minimized in a frequency band in which the first frequency band and the second frequency band overlap.

9. The multiplexer according to claim 1, wherein:
the first path and the second path are the same from the first common terminal to a branch node, and
the demultiplexing circuit further comprises a fourth impedance circuit connected in the first and second paths between the first common terminal and the branch node.

10. The multiplexer according to claim 9, wherein the fourth impedance circuit comprises a fourth capacitor in the first and second paths.

11. The multiplexer according to claim 9, wherein the fourth impedance circuit comprises a second inductor connected between ground and a node of first and second paths.

12. The multiplexer according to claim 9, wherein the fourth impedance circuit comprises:
   a fourth capacitor in the first and second paths, and
   a second inductor connected between ground and a node of the first and second paths.

13. The multiplexer according to claim 1,
   wherein the switch circuit comprises:
      a first switch having a first terminal connected to the first node and a second terminal connected to the third impedance circuit, and
      a second switch having a first terminal connected to the second node and a second terminal connected to the third impedance circuit interposed therebetween, and
   wherein the switch circuit is configured to exclusively switch the first and second switches such that only the first node or the second node is connected to ground with the third impedance circuit interposed therebetween.

14. The multiplexer according to claim 1, the multiplexer further comprising:
   a third filter configured to pass a radio frequency signal in a third frequency band, the third frequency band at least partially overlapping the first frequency band and the second frequency band,
   wherein the demultiplexing circuit further comprises:
      a third individual terminal connected to the third filter, and
      a fifth impedance circuit in third path, the third path connecting the first common terminal and the third individual terminal, and
   the switch circuit is configured to selectively connect only the first node, the second node, or a third node to ground, the third node being in the third path between the fifth impedance circuit and the third individual terminal.

15. A multiplexer system comprising:
   a plurality of the multiplexers according to claim 1; and
   a matching circuit, wherein:
   a first band including the first frequency band and the second frequency band of a first of the multiplexers is greater than a second band including the first frequency band and the second frequency band of a second of the multiplexers, and
   the matching circuit comprises:
      a second common terminal to which the first common terminal of the first multiplexer, and the first common terminal of the second multiplexer, are commonly connected,
      a fifth capacitor in a fourth path, the fourth path connecting the second common terminal and the first common terminal of the first multiplexer,
      a third switch connected between ground and a node on the fourth path, the node on the fourth path being between the fifth capacitor and the first common terminal of the first multiplexer,
      a third inductor in a fifth path, the fifth path connecting the second common terminal and the first common terminal of the second multiplexer, and
      a fourth switch connected between ground and a node on the fifth path, the node on the fifth path being between the third inductor and the first common terminal of the second multiplexer.

16. A radio frequency front-end circuit comprising:
the multiplexer according to claim 1; and
an amplification circuit connected to the multiplexer.

17. A communication device comprising:
the radio frequency front-end circuit according to claim 16; and
a radio frequency signal processing circuit configured to perform signal processing on a radio frequency signal output to the radio frequency front-end circuit and on a radio frequency signal input from the radio frequency front-end circuit,
wherein the radio frequency signal processing circuit is further configured to selectively switch connection by the switch circuit.

* * * * *